United States Patent
Hamilton et al.

(10) Patent No.: US 9,748,096 B2
(45) Date of Patent: Aug. 29, 2017

(54) METHODS OF PREPARATION OF SEMICONDUCTOR NANOCRYSTALS GROUP IIIA AND GROUP VA ELEMENTS

(71) Applicant: SAMSUNG ELECTRONICS CO., LTD., Suwon-si (KR)

(72) Inventors: Charles Hamilton, Oak Park, IL (US); Justin W. Kamplain, Bartlesville, OK (US); Catherine Mauck, Chicago, IL (US); Whitney Miller, Lowell, MA (US); Jonathan S. Steckel, Cupertino, CA (US); Chunming Wang, Acton, MA (US); Zhiming Wang, Port Lavaca, TX (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/542,586

(22) Filed: Nov. 15, 2014

(65) Prior Publication Data
US 2015/0166341 A1    Jun. 18, 2015

Related U.S. Application Data

(63) Continuation of application No. PCT/US2013/041061, filed on May 15, 2013.
(Continued)

(51) Int. Cl.
*H01L 21/02* (2006.01)
*H01L 33/50* (2010.01)
(Continued)

(52) U.S. Cl.
CPC ........ *H01L 21/02628* (2013.01); *B82Y 30/00* (2013.01); *C01B 25/087* (2013.01);
(Continued)

(58) Field of Classification Search
CPC ................. H01L 33/505; H01L 33/502; H01L 21/02598; H01L 29/0665; H01L 21/02601; H01L 21/02628; C01B 25/087
See application file for complete search history.

(56) References Cited

U.S. PATENT DOCUMENTS 6,106,609 A    8/2000   Yang et al.
6,322,901 B1   11/2001  Bawendi et al.
(Continued)

FOREIGN PATENT DOCUMENTS

EP    0109628 A1       5/1984
WO    WO2005022120 A2  3/2005
(Continued)

OTHER PUBLICATIONS

Cao, et al., "Synthesis and Characterization of InAs/InP and InAs/CdSe Core/Shell Nanocrystals" *Angew. Chem. Int. Ed.* (1999), vol. 38, No. 24, pp. 3692-3694.
(Continued)

*Primary Examiner* — Michael Jung
(74) *Attorney, Agent, or Firm* — Cantor Colburn, LLP

(57) ABSTRACT

A method for preparing semiconductor nanocrystals is disclosed. The method includes adding one or more cation precursors and one or more anion precursors in a reaction mixture including a solvent in a reaction vessel, maintaining the reaction mixture at a first temperature and for a first time period sufficient to produce semiconductor nanocrystal seed particles of the cation and the anion, and maintaining the reaction mixture at a second temperature that is higher than the first temperature for a second time period sufficient to enlarge the semiconductor nanocrystal seed particles to produce semiconductor nanocrystals from the cation and the anion.

14 Claims, 4 Drawing Sheets

Related U.S. Application Data

(60) Provisional application No. 61/647,296, filed on May 15, 2012.

(51) Int. Cl.
| | |
|---|---|
| *H01L 29/06* | (2006.01) |
| *C01B 25/08* | (2006.01) |
| *C09K 11/02* | (2006.01) |
| *C09K 11/56* | (2006.01) |
| *C09K 11/70* | (2006.01) |
| *B82Y 30/00* | (2011.01) |
| *B82Y 40/00* | (2011.01) |

(52) U.S. Cl.
CPC ............ *C09K 11/02* (2013.01); *C09K 11/565* (2013.01); *C09K 11/70* (2013.01); *H01L 21/02598* (2013.01); *H01L 21/02601* (2013.01); *H01L 29/0665* (2013.01); *H01L 33/502* (2013.01); *H01L 33/505* (2013.01); *B82Y 40/00* (2013.01); *C01P 2004/64* (2013.01); *C01P 2006/40* (2013.01); *H01L 2933/0025* (2013.01); *H01L 2933/0041* (2013.01); *Y10S 977/774* (2013.01); *Y10S 977/932* (2013.01)

(56) References Cited

U.S. PATENT DOCUMENTS

| | | | |
|---|---|---|---|
| 6,576,291 | B2 | 6/2003 | Bawendi et al. |
| 7,147,712 | B2 | 12/2006 | Zehnder et al. |
| 7,172,791 | B2 | 2/2007 | Treadway et al. |
| 7,250,082 | B2 | 7/2007 | Jang et al. |
| 7,465,352 | B2 | 12/2008 | Cao |
| 7,476,599 | B2 | 1/2009 | Wang et al. |
| 7,557,028 | B1 | 7/2009 | Scher et al. |
| 8,354,785 | B2 | 1/2013 | Clough et al. |
| 9,136,428 | B2 | 9/2015 | Clough et al. |
| 2002/0066401 | A1 | 6/2002 | Peng et al. |
| 2003/0010987 | A1 | 1/2003 | Banin et al. |
| 2003/0173541 | A1 | 9/2003 | Peng et al. |
| 2003/0209105 | A1 | 11/2003 | Bawendi et al. |
| 2004/0122248 | A1 | 6/2004 | Shenai-Khatkhate et al. |
| 2005/0119105 | A1 | 6/2005 | Zimmer et al. |
| 2005/0123765 | A1 | 6/2005 | Ong et al. |
| 2005/0129947 | A1 | 6/2005 | Peng et al. |
| 2005/0209123 | A1 | 9/2005 | Laux |
| 2005/0258418 | A1 | 11/2005 | Steckel et al. |
| 2006/0006396 | A1 | 1/2006 | Chua et al. |
| 2006/0110279 | A1 | 5/2006 | Han et al. |
| 2006/0110313 | A1 | 5/2006 | Cho et al. |
| 2006/0130741 | A1 | 6/2006 | Peng et al. |
| 2006/0157720 | A1* | 7/2006 | Bawendi ............ C09K 11/565 257/98 |
| 2006/0202167 | A1 | 9/2006 | Landry et al. |
| 2007/0049765 | A1 | 3/2007 | Lucey et al. |
| 2007/0221121 | A1 | 9/2007 | Zehnder et al. |
| 2007/0289491 | A1 | 12/2007 | Peng et al. |
| 2008/0099728 | A1 | 5/2008 | Jin et al. |
| 2008/0160306 | A1* | 7/2008 | Mushtaq ............ C01B 25/082 428/402 |
| 2008/0199381 | A1* | 8/2008 | Tokumitsu ............ C09K 11/70 423/299 |
| 2008/0202383 | A1 | 8/2008 | Shi |
| 2008/0247932 | A1 | 10/2008 | Li et al. |
| 2008/0258159 | A1 | 10/2008 | Jun et al. |
| 2009/0073349 | A1 | 3/2009 | Park et al. |
| 2009/0162011 | A1 | 6/2009 | Coe-Sullivan et al. |
| 2009/0230382 | A1 | 9/2009 | Banin et al. |
| 2009/0278141 | A1 | 11/2009 | Coe-Sullivan et al. |
| 2010/0052512 | A1 | 3/2010 | Clough et al. |
| 2010/0068468 | A1 | 3/2010 | Coe-Sullivan et al. |
| 2010/0090164 | A1* | 4/2010 | Peng ............ C09K 11/02 252/301.4 R |
| 2010/0159248 | A1* | 6/2010 | Jang ............ C09K 11/025 428/403 |
| 2010/0226849 | A1 | 9/2010 | Peng |
| 2010/0265307 | A1 | 10/2010 | Linton et al. |
| 2010/0283014 | A1 | 11/2010 | Breen et al. |
| 2011/0081538 | A1 | 4/2011 | Linton |
| 2011/0097879 | A1 | 4/2011 | Reiss et al. |
| 2011/0103064 | A1 | 5/2011 | Coe-Sullivan et al. |
| 2011/0186811 | A1 | 8/2011 | Coe-Sullivan et al. |
| 2011/0223110 | A1 | 9/2011 | Bartel et al. |
| 2011/0245533 | A1 | 10/2011 | Breen et al. |
| 2012/0113671 | A1 | 5/2012 | Sadasivan et al. |
| 2012/0187367 | A1 | 7/2012 | Modi et al. |
| 2012/0189791 | A1 | 7/2012 | Modi et al. |
| 2012/0256141 | A1 | 10/2012 | Nick et al. |
| 2013/0069018 | A1 | 3/2013 | Zhu et al. |
| 2013/0092886 | A1* | 4/2013 | Kahen ............ C09K 11/02 252/519.4 |
| 2013/0193407 | A1 | 8/2013 | Clough et al. |
| 2013/0273247 | A1 | 10/2013 | Kamplain et al. |
| 2014/0227862 | A1 | 8/2014 | Song et al. |
| 2014/0322901 | A1 | 10/2014 | Huang et al. |
| 2015/0004775 | A1 | 1/2015 | Huang et al. |
| 2015/0013589 | A1 | 1/2015 | Liu et al. |
| 2015/0014586 | A1 | 1/2015 | Liu et al. |
| 2015/0021548 | A1 | 1/2015 | Liu et al. |
| 2016/0068750 | A1 | 3/2016 | Clough et al. |

FOREIGN PATENT DOCUMENTS

| | | |
|---|---|---|
| WO | WO2009097319 A2 | 8/2009 |
| WO | WO2013173409 A1 | 11/2013 |

OTHER PUBLICATIONS

Hollingsworth, et al., "Soft Chemical Synthesis and Manipulation of Semiconductor Nanocrystals", *Semiconductor and Metal Nanocrystals: Synthesis and Electronic and Optical Properties*, Klimov, ed. 2004, Marcel Dekker, pp. 1-64.

Kortan, et al., "Nucleation and Growth of CdSe on ZnS Quantum Crystallite Seeds, and Vice Versa, in Inverse Micelle Media", *J. Am. Chem. Soc.* (1990), vol. 112, pp. 1327-1332.

Kumar, S. et al., "Synthesis and electrochemical properties of InP nanocrystals", J. Mater. Res., vol. 21, No. 3, 543-546, Mar. 2006.

Li, et al., "One-Pot Synthesis of Highly Luminescent Inp/Zns Nanocrsytals Without Precursor Injection", J. Am. Chem. Soc. (2008), vol. 130, pp. 11588-11589.

Lucey, D. et al., "Monodispersed InP Quantum Dots Prepared by Colloidal Chemistry in a Noncoordinating Solvent" Chemistry of Materials 2005, 17 (14) 3754-3762.

Murray, et al., "Synthesis and Characterization of Nearly Monodisperse CdE (E=S, Se, Te) Semiconductor Nanocrystallites", *J. Am. Chem. Soc.*, (1993) vol. 115, pp. 8706-8715.

Murray, C. B., Et al. "Synthesis and Characterization of Monodisperse Nanocrystals and Close-Packed Nanocrystal Assemblies", *Annu. Rev. Mater. Sci.* 2000, 30, 545.

PCT/US2013/041061: Search Report and Written Opinion mailed Oct. 22, 2013, for International Application No. PCT/US2014/041061 which is the parent of this case.

Ryu, et al., "Step-Wise Synthesis of InP/ZnS Core#Shell Quantum Dots and the Role of Zinc Acetate", Chem. Mater. (2009), vol. 21, No. 4, pp. 573-575.

Shweky, et al., "Seeded growth of InP and InAs quantum rods using indium acetate and myristic acid", *Materials Science and Engineering C* (2006), vol. 26, pp. 788-794.

Trikalitis, et al., "Mesostructured cobalt and nickel molybdenum sulfides", *Microporous and Mesoporous Materials* (online), vol. 88, Iss. 1-3, pp. 187-190.

Xie, et al., "Synthetic Scheme for High-Quality InAs Nanocrystals Based on Self-Focusing and One-Pot Synthesis of InAs-Based Core-Shell Nanocrystals" *Angew. Chem. Int. Ed.* (2008), vol. 47, pp. 7677-7680.

Xie, et al., Supporting Information, 6 pgs., for: "Synthetic Scheme for High-Quality InAs Nanocrystals Based on Self-Focusing and

(56) References Cited

OTHER PUBLICATIONS

One-Pot Synthesis of InAs-Based Core-Shell Nanocrystals" *Angew. Chem. Int. Ed.* (2008), vol. 47, pp. 7677-7680.

Xie, et al., "Colloidal InP nanocrsytals as efficient emitters covering blue to near infrared", J. Am. Chem. Soc. (2007), vol. 129, pp. 15432-15433.

Xie, et al., "InAs/InP/ZnSe Core/Shell/Shell Quantum Dots as Near-Infrared Emitters: Bright, Narrow-Band, Non-Cadmium Containing, and Biocompatible" *Nano Res* (2008), vol. 1, pp. 457-464.

Xu, S., et al., "Rapid synthesis of highly luminescent InP and InP/ZnS nanocrsytals", J. Mater. Chem., (2008), vol. 18, pp. 2653-2656.

Xu, S., et al., "Rapid Synthesis of High-Quality InP Nanocrystals", *J. Am. Chem. Soc.* (Jan. 7, 2006), vol. 128, No. 4, pp. 1054-1055.

Zimmer, et al., "Size Series of Small Indium Arsenide—Zinc Selenide Core—Shell Nanocrystals and Their Application to In Vivo Imaging" *J. Am. Chem. Soc.* (2006), vol. 128, pp. 2526-2527.

Zimmer, et al., Supporting Information, pp. 1-10, for: "Size Series of Small Indium Arsenide—Zinc Selenide Core—Shell Nanocrystals and Their Application to In Vivo Imaging" *J. Am. Chem. Soc.* (2006), vol. 128, pp. 2526-2527.

\* cited by examiner

METHODS OF PREPARATION OF SEMICONDUCTOR NANOCRYSTALS GROUP IIIA AND GROUP VA ELEMENTS

This application is a continuation of International Application No. PCT/US2013/041061, filed 15 May 2013, which was published in the English language as International Publication No. WO 2013/173409 A1 on 21 Nov. 2013, which International Application claims priority to U.S. Provisional Patent Application No. 61/647,296, filed on 15 May 2012. Each of the foregoing is hereby incorporated herein by reference in its entirety for all purposes.

TECHNICAL FIELD OF THE INVENTION

The present invention relates to the technical field of nanotechnology, and more particularly to semiconductor nanocrystals and methods for preparing same.

SUMMARY OF THE INVENTION

Embodiments of the present invention are directed to a reaction that produces semiconductor nanocrystals also referred to herein as "quantum dots." Embodiments of the present invention are directed to methods of preparing semiconductor nanocrystals of a semiconductor material including one or more elements of Group IIIA of the Periodic Table of Elements and one or more elements of Group VA of the Periodic Table of Elements. The method includes heating a mixture of a carboxylic acid compound and a first solvent in a reaction vessel at a first temperature of between about 25° C. and about 130° C. or between about 25° C. and about 150° C. One or more Group IIIA element precursors in a second solvent and one or more Group VA element precursors in a third solvent are added to the reaction vessel to form a reaction mixture which is heated at the first temperature for a first period of time. An amine is added to the reaction mixture which is heated at a second temperature of between about 25° C. and about 130° C. or between about 25° C. and about 150° C. for a second period of time. The temperature of the reaction mixture is subjected to or otherwise increased to a third temperature of between about 150° C. and about 300° C. for a third period of time sufficient to form semiconductor nanocrystal seed particles of predetermined size and/or wavelength characteristic.

According to certain aspects, the methods described herein produce semiconductor nanocrystals, such as InP semiconductor nanocrystals, of a desired particle size and/or wavelength characteristic and preferably, a narrow size distribution. The methods described herein allow one to alter reaction conditions, such as temperature, and reagents, such as the relative amounts of one or more Group IIIA element precursors and one or more Group VA element precursors, one or more acids, such as carboxylic acids, and one or more amines, preferably a secondary amine, in a manner to tune particles to a desired particle size, preferably, with a narrow particle size distribution. In addition, methods are provided where ingredients may be added as a mixture or may be added separately. In addition, methods are provided where ingredients may be added in a particular order, in a particular manner and heated to a particular temperature and for a particular period of time to form semiconductor nanocrystal seed particles of predetermined size or wavelength.

According to certain aspects, recovery of semiconductor nanocrystal seeds prepared as described herein can be affected by the use of different carboxylic acids. For example, certain carboxylic acids may alter or improve semiconductor nanocrystal seed recovery. Exemplary carboxylic acids include myristic acid and stearic acid. According to one aspect, for example, inclusion of stearic acid may improve semiconductor nanocrystal seed recovery for a given reaction including a Group III element, such as indium, and a Group V element, such as phosphorous.

According to a certain aspect, reaction mixtures described herein may be degassed. Reagents, components or solvents may be placed in a reaction vessel and degassed to the extent that oxygen is removed to create an oxygen free condition. Additional reagents, components or solvents may be added to the reaction vessel under oxygen free conditions. According to one aspect, one or more reagents, components or solvents of the reaction mixture are degassed and the one or more reagents, components or solvents are combined together. According to one aspect, all reagents, components or solvents of the reaction mixture are degassed and are combined together. According to one aspect, a degassed or oxygen free reaction mixture is provided for producing semiconductor nanocrystals. According to one aspect, the reaction mixture is under oxygen free conditions. An oxygen-free condition refers to a condition or an atmosphere where oxygen is substantially or completely absent. An oxygen-free condition can be provided by a nitrogen atmosphere or other inert gas atmosphere where oxygen is absent or substantially absent. In addition, an oxygen-free condition can be provided by removing oxygen from a reagent or reaction mixture such as by placing the reagent or reaction mixture under vacuum or forcing an inert gas through the reagent or reaction mixture to remove oxygen or both.

According to a certain aspect, a method of preparing semiconductor nanocrystals of a semiconductor material including one or more elements of Group IIIA of the Periodic Table of Elements and one or more elements of Group VA of the Periodic Table of Elements is provided. A mixture including a carboxylic acid and first solvent in a reaction vessel is heated at a first temperature of between about 25° C. and about 130° C. or between about 25° C. and about 150° C. A mixture including an organometallic indium-containing compound in a second solvent and a Group VA element precursor in a third solvent is added to the reaction vessel to form a reaction mixture which is heated at the first temperature for a first period of time. An amine is added to the reaction mixture at a second temperature of between about 25° C. and about 130° C. or between about 25° C. and about 150° C. for a second period of time. The reaction mixture is subject or heated or otherwise increased to a third temperature of between about 150° C. and about 300° C. for a third period of time sufficient to form semiconductor nanocrystal seed particles having a predetermined size and/or that absorb at a predetermined wavelength. According to one aspect, the reaction mixture may be oxygen free.

According to a certain aspect, a method of preparing semiconductor nanocrystals of a semiconductor material including one or more elements of Group IIIA of the Periodic Table of Elements and one or more elements of Group VA of the Periodic Table of Elements is provided. A mixture including a carboxylic acid and a first solvent in a reaction vessel is heated at a first temperature of between about 25° C. and about 130° C. or between about 25° C. and about 150° C. One or more Group VA element precursors in a second solvent is added to the reaction vessel and heated at the first temperature. An organometallic indium-containing compound in a third solvent is added to the reaction vessel to form a reaction mixture which is heated at the first temperature for a first period of time. An amine is added to the reaction mixture at a second temperature of between about 25° C. and about 130° C. or between about 25° C. and about 150° C. for a second period of time. The reaction mixture is heated to a third temperature of between about 150° C. and about 300° C. for a third period of time sufficient to form semiconductor nanocrystal seed particles of a predetermined size and/or that absorb at a predetermined wavelength. According to one aspect, the reaction mixture may be oxygen free.

According to a certain aspect, a method of preparing semiconductor nanocrystals of a semiconductor material including one or more elements of Group IIIA of the Periodic Table of Elements and one or more elements of Group VA of the Periodic Table of Elements is provided. A mixture including one or more Group IIIA element precursors in a first solvent is heated at a first temperature of between about 25° C. and about 130° C. or between about 25° C. and about 150° C. Semiconductor nanocrystal seed particles are added to the mixture and subjected to or otherwise heated to a temperature of between about 150° C. and about 300° C. One or more Group VA element precursors are added to the reaction vessel in a controlled manner and for a period of time sufficient to form semiconductor nanocrystal core particles of a predetermined size and/or that absorb at a predetermined wavelength.

According to a certain aspect, a method of preparing semiconductor nanocrystals of a semiconductor material including one or more elements of Group IIIA of the Periodic Table of Elements and one or more elements of Group VA of the Periodic Table of Elements is provided. A mixture including one or more pure Group IIIA element precursors, a carboxylic acid and a solvent is heated at a first temperature of between about 25° C. and about 130° C. or between about 25° C. and about 150° C. Semiconductor nanocrystal seed particles are added to the mixture and subjected to or otherwise heated to a temperature of between about 150° C. and about 300° C. One or more Group VA element precursors are added to the mixture in a controlled manner and for a period of time sufficient to form semiconductor nanocrystal core particles of predetermined size and/or that absorb at a predetermined wavelength.

According to a certain aspect, a method of preparing semiconductor nanocrystals of a semiconductor material including one or more elements of Group IIIA of the Periodic Table of Elements and one or more elements of Group VA of the Periodic Table of Elements is provided. A mixture including one or more pure Group IIIA element precursors and a first solvent is heated at a first temperature of between about 25° C. and about 130° C. or between about 25° C. and about 150° C. Semiconductor nanocrystal seed particles are added to the heated mixture and subjected to a second temperature of between about 150° C. and about 300° C. One or more Group VA element precursors in a second solvent and a carboxylic acid in a third solvent are added to the heated mixture in a controlled manner and for a period of time sufficient to form semiconductor nanocrystal core particles of predetermined size and/or that absorb at a predetermined wavelength.

According to a certain aspect, a method of preparing semiconductor nanocrystals of a semiconductor material including one or more elements of Group IIIA of the Periodic Table of Elements and one or more elements of Group VA of the Periodic Table of Elements is provided. A mixture including one or more pure Group IIIA element precursors and a first solvent in a reaction vessel is heated at a first temperature of between about 25° C. and about 130° C. or between about 25° C. and about 150° C. Semiconductor nanocrystal seed particles in a second solvent and a carboxylic acid in third solvent are added to the reaction vessel and subjected to or otherwise heated to a temperature of between about 150° C. and about 300° C. One or more Group VA element precursors in a fourth solvent is added to the heated mixture in a controlled manner and for a period of time sufficient to form semiconductor nanocrystal core particles of predetermined size and/or that absorb at a predetermined wavelength.

In certain embodiments, the one or more Group IIIA element precursors and the one or more Group VA precursors can be added separately to a reaction vessel. According to one aspect, the one or more Group IIIA element precursors can be added to the reaction vessel with the one or more Group VA precursors already present in the reaction vessel. According to one aspect, the one or more Group VA precursors can be added to the reaction vessel with the one or more Group IIIA element precursors already present in the reaction vessel. According to one aspect, the one or more Group IIIA element precursors can be added to the reaction vessel simultaneously with the one or more Group VA precursors. According to one aspect, the one or more Group IIIA element precursors and the one or more Group VA precursors can be added in series to the reaction vessel.

In certain embodiments, the one or more Group IIIA element precursors and the one or more Group VA precursors are added to the reaction vessel as a single precursor mixture. According to this aspect, the one or more Group IIIA element precursors and the one or more Group VA precursors are mixed together in a solvent to produce a solution. In certain embodiments, the precursor mixture is added to a reaction vessel containing a mixture including one or more acids and a solvent to produce a reaction mixture for reaction. One or more carboxylic acids may be present. One or more amines may be present. The reaction mixture is heated at a temperature which forms semiconductor nanocrystal seed particles.

According to certain aspects, methods are provided to grow or enlarge semiconductor seed particles. The methods may be carried out with in situ generated seed particles or with seed particles that have been isolated from the medium in which they were formed. Certain aspects include adding additional precursors to a reaction mixture including the seed particles. According to a certain aspect, additional precursors are added to a reaction mixture including the seed particles in a metered or controlled manner such as by slow or dropwise addition over a certain time period.

According to certain aspects, methods are provided for using impure or substantially impure cation precursor salt compounds in the methods described herein. Such impure or substantially impure cation precursor salt compounds may advantageously avoid the need for a growth promoting compound.

According to certain aspects, methods are provided for using pure or substantially pure cation precursor salt compounds in the methods described herein. Such methods include use of a growth promoting compound such that semiconductor nanocrystals formed from the pure or substantially pure cation precursor salt compounds grow to a desired size or wavelength. Exemplary growth promoting compounds include the acid form of the salt in an amount sufficient to promote semiconductor nanocrystal growth. For example, if pure or substantially pure indium myristate is used as the cation precursor salt compound, then a suitable growth promoting compound would be myristic acid. A suitable amount of a growth promoting compound is preferably within the range of about 0.25 to about 2 molar equivalents relative to the Group V precursor.

In certain embodiments, the method further comprises isolating the semiconductor nanocrystal seed particles from the reaction mixture. In certain embodiments, the method further comprises isolating the semiconductor nanocrystal core particles from the reaction mixture.

According to certain embodiments, semiconductor nanocrystal seed particles or semiconductor nanocrystal core particles prepared according to the methods described herein can be provided with one or more coatings or layers. A semiconductor nanocrystal on which a coating or layer is provided may be referred to herein as a core, a core particle, a nanocrystal core particle, a semiconductor nanocrystal core or a semiconductor nanocrystal core particle. According to certain methods, a coating reaction mixture including a population of nanocrystal core particles, one or more overcoat cation precursors, one or more overcoat anion precursors and a solvent is provided. The coating reaction mixture may also contain one or more acids. The coating reaction mixture may also contain one or more amine compounds. The temperature of the coating reaction mixture is sufficient to form an overcoat material comprising one or more cations and one or more anions on a surface of at least a portion of the nanocrystal core particles.

In accordance with another aspect of the present invention, there is provided a semiconductor nanocrystal prepared in accordance with any of the methods taught herein.

In accordance with another aspect of the present invention, there is provided a semiconductor nanocrystal prepared by the methods described herein comprising a core comprising a first semiconductor material comprising at least one Group III element and at least one Group V element and a layer or shell disposed over at least a portion of an outer surface of the core. The shell may include a second semiconductor material the same as or different from the first semiconductor material. The shell may include ligands attached to an outer surface of the shell.

The core-shell quantum dots of the present invention may be present, for example, in a matrix or host material and placed in capillaries which are used, for example, in back light units. The quantum dots may also be used in films or solid state lighting applications or in any application utilizing quantum dots, such as direct on-chip semiconductor LED applications, electroluminescent applications such as QLEDs, solar applications such as photovoltaic cells and concentrators, and diagnostic and medical applications such as labeling, imaging and the like.

The foregoing, and other aspects described herein, all constitute embodiments of the present invention.

It should be appreciated by those persons having ordinary skill in the art(s) to which the present invention relates that any of the features described herein in respect of any particular aspect and/or embodiment of the present invention can be combined with one or more of any of the other features of any other aspects and/or embodiments of the present invention described herein, with modifications as appropriate to ensure compatibility of the combinations. Such combinations are considered to be part of the present invention contemplated by this disclosure.

Additional information concerning the foregoing, and other information useful with the present inventions is provided below.

It is to be understood that both the foregoing general description and the following detailed description are exemplary and explanatory only and are not restrictive of the invention as claimed. Other embodiments will be apparent to those skilled in the art from consideration of the description and drawings, from the claims, and from practice of the invention disclosed herein.

Figure 1:
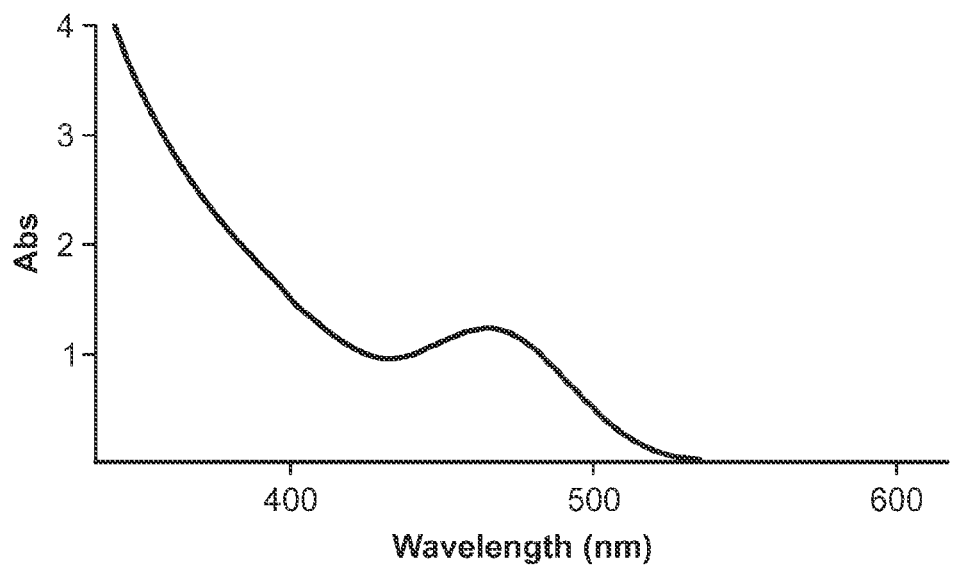
FIG. 1 is a graph of absorbance versus wavelength.

For a better understanding of the present invention, together with other advantages and capabilities thereof, reference is made to the following disclosure and appended claims in connection with the above-described drawings.

DETAILED DESCRIPTION OF THE INVENTION

Various aspects and embodiments of the present inventions will be further described in the following detailed description.

The present invention relates to methods and reactions for preparing semiconductor nanocrystals. Semiconductor nanocrystals as prepared herein may further be provided with a coating, layer or shell of a semiconductor material that is the same as or different from the semiconductor material of the semiconductor nanocrystal. The present invention further relates to semiconductor nanocrystals formed by the methods described herein. The present invention further also relates to populations of semiconductor nanocrystals formed by the methods described herein.

Embodiments of the present disclosure are directed to a method of preparing semiconductor nanocrystals of a semiconductor material including one or more elements of Group IIIA of the Periodic Table of Elements and one or more elements of Group VA of the Periodic Table of Elements. The method includes heating a mixture including a carboxylic acid compound and a first solvent in a reaction vessel at a first temperature of between about 25° C. and about 130° C. or between about 25° C. and about 150° C. According to alternate aspect, the first temperature may be between about 70° C. and about 125° C., or between about 80° C. and about 125° C. An exemplary first temperature is about 80° C. An exemplary first temperature is about 125° C.

One or more Group IIIA element precursors in a second solvent and one or more Group VA element precursors in a third solvent are added to the reaction vessel to form a reaction mixture which is subjected or otherwise heated at the first temperature for a first period of time. An amine is added to the reaction mixture at a second temperature of between about 25° C. and about 130° C. or between about 25° C. and about 150° C. for a second period of time. According to alternate aspect, the second temperature may be between about 70° C. and about 125° C., or between about 80° C. and about 125° C. An exemplary second temperature is about 80° C. An exemplary second temperature is about 125° C.

According to one aspect, the amine is added after adding the one or more Group IIIA element precursors and one or more Group VA element precursors to the reaction vessel. According to one aspect, the amine is a secondary amine. According to one aspect, the amine is a secondary amine of formula $(CH_3(CH_2)_n)_2NH$ wherein n=3-11. According to one aspect, the secondary amine includes a substituted alkyl group. According to one aspect, the amine is a diaromatic amine. According to one aspect, the amine is a substituted diaromatic amine. According to one aspect, amine is a diphenyl amine. According to one aspect, the secondary amine is one or more of dibutylamine, dipentylamine, dihexylamine, diheptylamine, dioctylamine, dinonylamine, didecylamine, didundecylamine, or didodecylamine. An exemplary amine is the secondary amine dioctylamine.

The reaction mixture is subjected to or otherwise increased to a third temperature of between about 150° C. and about 300° C. for a third period of time sufficient to form semiconductor nanocrystal seed particles of predetermined size or wavelength. According to a certain aspect, the third temperature may be between about 170° C. and about 275° C. An exemplary third temperature is about 175° C. An exemplary third temperature is about 250° C.

According to one aspect, the first time period is between about 5 minutes and about 10 minutes. The second period of time is between about 1 minute and about 30 minutes. The third period of time is between about 1 hour and about 3 hours.

According to one aspect, the predetermined size is less than about 2 nm in diameter.

According to one aspect, the reaction mixture includes one or more carboxylic acid compounds. In certain embodiments, one or more of the acids included in the mixture comprise a carboxylic acid compound. As used herein, a "carboxylic acid compound" refers to a compound including at least one carboxylic acid group. Carboxylic acid compounds may have one or more alkyl groups. In certain embodiments including a carboxylic acid compound in the mixture, at least one of the one or more carboxylic acid compounds comprises $CH_3(CH_2)_nC(O)OH$ wherein n=1-18. Examples of carboxylic acid compounds for use in the method include, but are not limited to, $CH_3(CH_2)_nC(O)OH$ wherein n=6-18. Carboxylic acid compounds an include one or more of octanoic [caprylic] acid, nonanoic [pelargonic] acid, decanoic [capric] acid, undecanoic acid, dodecanoic [lauric] acid, tridecanoic acid, tetradecanoic [myristic] acid, pentadecanoic acid, hexadecanoic [palmitic] acid, heptadecanoic [margaric] acid, octadecanoic [stearic] acid, nonadecanoic acid, eicosanoic [arachidic] acid or oleic acid. According to a certain aspect, the carboxylic acid compound is myristic acid. Other carboxylic acid compounds for use in the method can be identified by one of ordinary skill in the art.

According to one aspect, the first solvent is a weakly coordinating solvent or a noncoordinating solvent. An exemplary first solvent is 1-octadecene. According to one aspect, the second solvent is a weakly coordinating solvent or a noncoordinating solvent. According to one aspect, the third solvent is a weakly coordinating solvent or a noncoordinating solvent. An exemplary second or third solvent is Dowtherm A™ which is a eutectic mixture of biphenyl ether and diphenyl ether.

According to one aspect, the reaction mixture is oxygen free. According to one aspect, the reaction mixture is degassed.

According to one aspect, the one or more Group IIIA element precursors and the one or more Group VA element precursors are added to the reaction vessel as a mixture. Alternatively, the one or more Group IIIA element precursors and the one or more Group VA element precursors are simultaneously added to the reaction vessel. Alternatively, the one or more Group IIIA element precursors and the one or more Group VA element precursors are separately added to a reaction vessel. Alternatively, the one or more Group IIIA element precursors are added to the reaction vessel before the one or more Group VA element precursors are added to the reaction vessel. Alternatively, the one or more Group VA element precursors are added to the reaction vessel before the one or more Group IIIA element precursors are added to the reaction vessel.

According to an exemplary aspect, the one or more Group IIIA element precursors includes indium and the one or more Group VA element precursors includes phosphorous. An exemplary Group IIIA element precursor is trimethyl indium. An exemplary Group VA element precursor is tris(trimethylsilyl)phosphine.

According to a certain aspect, the one or more Group IIIA element precursors and the one or more Group VA element precursors are present in the reaction mixture in a ratio of between about greater than 1:1 and about 2:1. An exemplary ratio is about 1.1:1, about 1.2:1, about 1.3:1, about 1.4:1, about 1.5:1, about 1.6:1, about 1.7:1, about 1.8:1, about 1.9:1, or about 2:1.

According to a certain aspect, method described herein may include the step of isolating the semiconductor nanocrystal seed particles.

According to a certain aspect, a method of preparing semiconductor nanocrystals of a semiconductor material including one or more elements of Group IIIA of the Periodic Table of Elements and one or more elements of Group VA of the Periodic Table of Elements is provided including heating a mixture including a carboxylic acid and first solvent in a reaction vessel at a first temperature of between about 25° C. and about 130° C. or between about 25° C. and about 150° C., adding a mixture including an organometallic indium-containing compound in a second solvent and a Group VA element precursor in a third solvent to the reaction vessel to form a reaction mixture and subjecting or otherwise heating the reaction mixture at the first temperature for a first period of time, adding an amine to the reaction mixture and subjecting or otherwise heating the reaction mixture at a second temperature of between about 25° C. and about 130° C. or between about 25° C. and about 150° C. for a second period of time, and subjecting or otherwise heating the reaction mixture to a third temperature of between about 150° C. and about 300° C. for a third period of time sufficient to form semiconductor nanocrystal seed particles that absorb at a predetermined wavelength.

Embodiments of the present disclosure include a method of preparing semiconductor nanocrystals of a semiconductor material including one or more elements of Group IIIA of the Periodic Table of Elements and one or more elements of Group VA of the Periodic Table of Elements including heating a mixture including a carboxylic acid and a first solvent in a reaction vessel at a first temperature of between about 25° C. and about 130° C. or between about 25° C. and about 150° C., adding one or more Group VA element precursors in a second solvent to the reaction vessel at the first temperature, adding an organometallic indium-containing compound in a third solvent to the reaction vessel to form a reaction mixture and subjecting or otherwise heating the reaction mixture at the first temperature for a first period of time, adding an amine to the reaction mixture and heating the reaction mixture at a second temperature of between about 25° C. and about 130° C. or between about 25° C. and about 150° C. for a second period of time, and subjecting or otherwise heating the reaction mixture to a third temperature of between about 150° C. and about 300° C. for a third period of time sufficient to form semiconductor nanocrystal seed particles of a predetermined size.

In certain aspect, a solvent can comprise a mixture of solvents. In certain of such embodiments, a solvent comprises a weakly coordinating solvent. In certain of such embodiments, a solvent comprises a non-coordinating solvent. Examples of non-coordinating solvents for use in the methods taught herein include, but are not limited to, squalane, octadecane, or any other saturated hydrocarbon molecule. Mixtures of two or more solvents can also be used. Other non-coordinating solvents for use in the methods taught herein can be readily ascertained by one of ordinary skill in the art. In certain embodiments, non-coordinating solvents comprise liquids having a dipole moment in the range from 0 to about 0.2 µ/D. In certain embodiments, weakly coordinating solvents can be used. In certain embodiments, weakly coordinating solvents comprise liquids having a dipole moment in the range from 0.2 to 0.7 µ/D. Other non-coordinating solvents and weakly coordinating solvents that are compatible with the reaction conditions and that will not react with the semiconductor nanocrystals or ligands can be identified by one of ordinary skill in the art. In certain of such embodiments a solvent with a boiling point greater than 250° C. may be useful or desirable.

In certain embodiments, the reaction mixture includes one or more amine compounds. As used herein, an "amine compound" refers to any organic compounds that contains at least one basic nitrogen atom with a lone electron pair or compound that includes an organic functional group that contains at least one basic nitrogen atom with a lone electron pair. In certain embodiments, at least one of the one or more amine compounds is a primary amine. In certain embodiments, each of the one or more amine compounds is a primary amine. In certain embodiments, at least one of the one or more amine compounds is a secondary amine. In certain embodiments, each of the one or more amine compounds is a secondary amine. In certain embodiments including one or more amine compounds, a mixture of primary amines and secondary amines can be included. In certain embodiments of methods taught herein, the methods include an amine compound. Examples of amine compounds include, but are not limited to, primary amines, e.g., $CH_3(CH_2)_nNH_2$ wherein n=5-19 (e.g., hexylamine, heptylamine, octylamine, nonylamine, decylamine, undecylamine, dodecylamine, tridecylamine, tetradecylamine, pentadecylamine, hexadecylamine, heptadecylamine, octadecylamine, nonadecylamine, eicosylamine), and secondary amines, e.g., $(CH_3(CH_2)_n)_2NH$ wherein n=3-11 (e.g., dibutylamine, dipentylamine, dihexylamine, diheptylamine, dioctylamine, dinonylamine, didecylamine, didundecylamine, didodecylamine), etc. In certain embodiments, an amine comprises decylamine, octadecylamine, and/or oleylamine.). In certain embodiments, an amine compound has a boiling point greater than 200° C. In certain embodiments, an amine can comprise a tertiary amine. Other amines can be readily ascertained by one of ordinary skill in the art.

According to a certain aspect, reaction mixtures described herein may be degassed. Reagents, components or solvents may be placed in a reaction vessel and degassed to the extent that oxygen is removed to create an oxygen free condition. Additional reagents, components or solvents may be added to the reaction vessel under oxygen free conditions. According to one aspect, one or more reagents, components or solvents of the reaction mixture are degassed and the one or more reagents, components or solvents are combined together. According to one aspect, all reagents, components or solvents of the reaction mixture are degassed and are combined together. According to one aspect, a degassed or oxygen free reaction mixture is provided for producing semiconductor nanocrystals. According to one aspect, the reaction mixture is under oxygen free conditions. An oxygen-free condition refers to a condition or an atmosphere where oxygen is substantially or completely absent. An oxygen-free condition can be provided by a nitrogen atmosphere or other inert gas atmosphere where oxygen is absent or substantially absent. In addition, an oxygen-free condition can be provided by removing oxygen from a reagent or reaction mixture such as by placing the reagent or reaction mixture under vacuum or forcing an inert gas through the reagent or reaction mixture to remove oxygen or both.

According to certain embodiments, a method of preparing semiconductor nanocrystals of a semiconductor material including one or more elements of Group IIIA of the Periodic Table of Elements and one or more elements of Group VA of the Periodic Table of Elements is provided which includes heating a mixture including one or more Group IIIA element precursors in a first solvent at a first temperature of between about 25° C. and about 130° C. or between about 25° C. and about 150° C., adding semiconductor nanocrystal seed particles to the reaction vessel and subjecting or otherwise heating the mixture to a second temperature of between about 150° C. and about 300° C., and adding one or more Group VA element precursors to the reaction vessel in a controlled manner and for a period of time sufficient to form semiconductor nanocrystal core particles of a predetermined size.

According to certain aspects, an amine is present during the formation of the semiconductor nanocrystal core particles. Alternatively, an amine is absent during the formation of the semiconductor nanocrystal core particles.

According to one aspect, the one or more Group IIIA element precursors includes one or more cation salt precursors.

According to one aspect, the one or more Group VA element precursors are added to the reaction vessel in a dropwise manner.

According to one aspect, the ratio of the one or more Group IIIA element precursors to the one or more Group VA element precursors is about 1:1 to about 2:1. An exemplary ratio is about 1:1.

According to a certain aspect, a method preparing semiconductor nanocrystals of a semiconductor material including one or more elements of Group IIIA of the Periodic Table of Elements and one or more elements of Group VA of the Periodic Table of Elements is provided which includes mixing one or more pure Group IIIA element precursors and a carboxylic acid in a solvent in a reaction vessel and heating at a first temperature of between about 25° C. and about 130° C., adding semiconductor nanocrystal seed particles to the reaction vessel and heating the mixture to a temperature of between about 150° C. and about 300° C., and adding one or more Group VA element precursors to the reaction vessel in a controlled manner and for a period of time sufficient to form semiconductor nanocrystal core particles of predetermined size.

According to certain aspects, an amine is present during the formation of the semiconductor nanocrystal core particles. Alternatively, an amine is absent during the formation of the semiconductor nanocrystal core particles.

According to one aspect, the one or more pure Group IIIA element precursors and the carboxylic acid are added as a mixture. According to one aspect, the one or more pure Group IIIA element precursors and the carboxylic acid are added separately. According to one aspect, the one or more pure Group IIIA element precursors are added to the reaction vessel before the carboxylic acid is added to the reaction vessel. According to one aspect, the carboxylic acid is added to the reaction vessel before the one or more pure Group IIIA element precursors are added to the reaction vessel.

According to one aspect, the one or more Group IIIA element precursors includes one or more cation salt precursors. According to one aspect, the one or more Group IIIA element precursors includes indium myristate.

According to one aspect, the one or more Group VA element precursors are added to the reaction vessel in a dropwise manner.

According to one aspect, the ratio of the one or more Group IIIA element precursors to the one or more Group VA element precursors is about 1:1 to about 2:1. An exemplary ratio is about 1:1.

According to one aspect, the carboxylic acid is myristic acid or oleic acid.

According to one aspect, the one or more Group VA element precursors is tris(trimethylsilyl)phosphine.

According to a certain aspect, a method of preparing semiconductor nanocrystals of a semiconductor material including one or more elements of Group IIIA of the Periodic Table of Elements and one or more elements of Group VA of the Periodic Table of Elements is provided which includes heating a mixture including one or more pure Group IIIA element precursors and a first solvent in a reaction vessel at a first temperature of between about 25° C. and about 130° C., adding semiconductor nanocrystal seed particles to the reaction vessel and heating the mixture to a temperature of between about 150° C. and about 300° C., and adding one or more Group VA element precursors in a second solvent and a carboxylic acid in a third solvent to the reaction vessel in a controlled manner and for a period of time sufficient to form semiconductor nanocrystal core particles of predetermined size.

According to a certain aspect, an amine is present during the formation of the semiconductor nanocrystal core particles. Alternatively an amine is absent during the formation of the semiconductor nanocrystal core particles.

According to one aspect, the one or more Group VA element precursors and the carboxylic acid are added as a mixture. According to one aspect, the one or more Group VA element precursors and the carboxylic acid are added separately. According to one aspect, the one or more Group VA element precursors are added to the reaction vessel before the carboxylic acid is added to the reaction vessel. According to one aspect, the carboxylic acid is added to the reaction vessel before the one or more Group VA element precursors are added to the reaction vessel.

According to one aspect, the one or more Group IIIA element precursors includes one or more cation salt precursors. According to one aspect, the one or more Group IIIA element precursors includes indium myristate.

According to one aspect, the one or more Group VA element precursors and the carboxylic acid are added to the reaction vessel in a dropwise manner.

According to one aspect, the ratio of the one or more Group IIIA element precursors to the one or more Group VA element precursors is about 1:1 to about 2:1. An exemplary ratio is about 1:1.

According to one aspect, the carboxylic acid is myristic acid or oleic acid.

According to one aspect, the one or more Group VA element precursors is tris(trimethylsilyl)phosphine.

According to one aspect, a method of preparing semiconductor nanocrystals of a semiconductor material including one or more elements of Group IIIA of the Periodic Table of Elements and one or more elements of Group VA of the Periodic Table of Elements is provided which includes heating a mixture including one or more pure Group IIIA element precursors and a first solvent in a reaction vessel at a first temperature of between about 25° C. and about 130° C. or between about 25° C. and about 150° C., adding semiconductor nanocrystal seed particles in a second solvent and a carboxylic acid in third solvent to the reaction vessel and subjecting or otherwise heating the mixture to a second temperature of between about 150° C. and about 300° C., and adding one or more Group VA element precursors in a fourth solvent to the reaction vessel in a controlled manner and for a period of time sufficient to form semiconductor nanocrystal core particles of predetermined size.

According to one aspect, an amine is present during the formation of the semiconductor nanocrystal core particles. Alternatively, an amine is absent during the formation of the semiconductor nanocrystal core particles.

According to one aspect, the semiconductor nanocrystal seed particles and the carboxylic acid are added as a mixture. According to one aspect, the semiconductor nanocrystal seed particles and the carboxylic acid are added separately. According to one aspect, the semiconductor nanocrystal seed particles are added to the reaction vessel before the carboxylic acid is added to the reaction vessel. According to one aspect, the carboxylic acid is added to the reaction vessel before the semiconductor nanocrystal seed particles are added to the reaction vessel.

According to one aspect, the one or more Group IIIA element precursors includes one or more cation salt precursors. According to one aspect, the one or more Group IIIA element precursors includes indium myristate.

According to one aspect, the ratio of the one or more Group IIIA element precursors to the one or more Group VA element precursors is between about 1:1 to about 2:1. An exemplary ratio is about 1:1.

According to one aspect, the carboxylic acid is myristic acid or oleic acid.

According to one aspect, the one or more Group VA element precursors is tris(trimethylsilyl)phosphine.

According to certain embodiments, semiconductor nanocrystals prepared according to the methods described herein can be provided with one or more coatings or layers. A semiconductor nanocrystal on which a coating or layer is provided may be referred to herein as a core, a core particle, a nanocrystal core particle, a semiconductor nanocrystal core or a semiconductor nanocrystal core particle. According to certain methods, a coating reaction mixture including a population of nanocrystal core particles, one or more overcoat cation precursors, one or more overcoat anion precursors and a solvent is provided. The coating reaction mixture may also contain one or more acids. The coating reaction mixture may also contain one or more amine compounds. The temperature of the coating reaction mixture is sufficient to form an overcoat material comprising one or more cations and one or more anions on a surface of at least a portion of the nanocrystal core particles in the second mixture. In certain of such embodiments, the temperature of the coating reaction mixture is in a range from about 150° C. to about 350° C. In certain of such embodiments, the temperature of the coating reaction mixture is in a range from about 150° C. to about 300° C. In certain of such embodiments, the temperature of the coating reaction mixture is in a range from about 200° C. to about 250° C.

In accordance with another aspect of the present invention, there is provided a semiconductor nanocrystal prepared in accordance with any of the methods taught herein.

In accordance with another aspect of the present invention, there is provided a semiconductor nanocrystal comprising a core comprising a first semiconductor material comprising at least one Group III element and at least one Group V element and a layer or shell disposed over at least a portion of an outer surface of the core. The shell may include a second semiconductor material the same as or different from the first semiconductor material. The shell may include ligands attached to an outer surface of the shell. The ligands may include a phosphonic acid compound further including one or more aromatic groups and an amine compound further including one or more aromatic groups. In certain embodiments, the ligands include phenylbutyl amine, decyl amine, benzylphosphonic acid or octadecyl phosphonic acid.

In certain embodiments, the reaction is carried out in an inert atmosphere, where exposure to air is substantially, and preferably completely, precluded.

In certain embodiments, a semiconductor nanocrystal can comprise a semiconductor material comprising one or more elements of Group III (e.g., B, Al, Ga, In, Tl) and one or more elements of Group V (e.g., N, P, As, Sb, Bi) (e.g., binary, ternary, and quaternary III-V compositions).

As used herein, "cation" refers to a metal element (e.g., a Group III (e.g., B, Al, Ga, In, Tl) included in a semiconductor nanocrystal; wherein the valence of the element can include zero. As used herein, "anion" refers to a non-metal element (e.g., a Group V (e.g., N, P, As, Sb, Bi) included in a semiconductor nanocrystal); wherein the valence of the element can include zero.

The size and composition of a semiconductor nanocrystal affects its characteristic spectral emission wavelength. Thus, the size and composition of a semiconductor nanocrystal is readily selected by one of ordinary skill in the art such that the semiconductor nanocrystal emits photons at a predetermined wavelength in the desired portion of the spectrum.

Examples of Group III cation precursors include Group III elements, covalent compounds, ionic compounds, and/or coordination complexes, that serve as a source for a Group III element(s) in the resulting nanocrystal. For example, a Group III cation precursor can constitute a wide range of substances, including, but not limited to, a metal oxide, a metal carbonate, a metal bicarbonate, a metal sulfate, a metal sulfite, a metal phosphate, metal phosphite, a metal halide, a metal carboxylate, other metal salts, a metal alkoxide, a metal thiolate, a metal amide, a metal imide, a metal alkyl, a metal aryl, other organometallic compounds, a metal coordination complex, a metal solvate, etc. For example, non-limiting examples of indium precursors include In(III) acetate, In(III) trifluoroacetate, trialkyl indium ($InR_3$) (wherein R=methyl, ethyl, propyl, butyl, pentyl, hexyl, isopropyl, isobutyl, tert-butyl, etc.). Other Group III cation precursors can be readily ascertained by one of ordinary skill in the art.

Examples of Group V anion precursors include elements, covalent compounds, or ionic compounds that serve as a source for a Group V element(s) in the resulting nanocrystal. Group V precursors are most often selected from the Group V elements themselves (oxidation state 0), covalent compounds, or ionic compounds of the group V elements (N, P, As, or Sb). For example, non-limiting examples of phosphorus precursors include $P(SiR_3)_3$ wherein R=methyl, ethyl, propyl, butyl, pentyl, hexyl, isopropyl, isobutyl, tert-butyl, etc.), and phosphine. Other Group V precursors can be readily ascertained by one of ordinary skill in the art.

In certain embodiments, semiconductor nanocrystals comprising binary materials, ternary materials, quaternary materials, and even more complex species may be prepared using the methods described herein, in which case more than one cation precursor and/or more than one anion precursor may be included.

In certain embodiments, a semiconductor nanocrystal can include a semiconductor material comprising one or more elements of Group III and one or more elements of Group V (e.g., binary, ternary, and quaternary III-V compositions).

A semiconductor nanocrystal may also be referred to herein as a semiconductor nanoparticle, a nanocrystal, or a quantum dot.

A semiconductor nanocrystal is capable of emitting light upon excitation. A semiconductor nanocrystal can be excited by irradiation with an excitation wavelength of light, by electrical excitation, or by other energy transfer.

Photoluminescence quantum efficiency (also referred to as quantum efficiency, quantum yield or solution quantum yield) represents the percent of absorbed photons that are reemitted as photons upon excitation by irradiation with an excitation wavelength of light.

A nanocrystal is a nanometer sized particle, e.g., in the size range of up to about 1000 nm. In certain embodiments, a nanocrystal can have a size in the range of up to about 100 nm. In certain embodiments, a nanocrystal can have a size in the range up to about 20 nm (such as about 1, 2, 3, 4, 5, 6, 7, 8, 9, 10, 11, 12, 13, 14, 15, 16, 17, 18, 19, or 20 nm). In certain embodiments, a nanocrystal can have a size less than 100 Å. In certain embodiments, a nanocrystal has a size in a range from about 1 to about 6 nanometers and more particularly from about 1 to about 5 nanometers. The size of a nanocrystal can be determined, for example, by direct transmission electron microscope measurement. Other known techniques can also be used to determine nanocrystal size.

Nanocrystals can have various shapes. Examples of the shape of a nanocrystal include, but are not limited to, sphere, rod, disk, tetrapod, other shapes, and/or mixtures thereof.

A semiconductor nanocrystal can further include an overcoating or shell over at least a portion of, and preferably all of, the outer surface of the semiconductor nanocrystal. In certain embodiments, the shell comprises one or more semiconductor materials. In certain embodiments, the one or more additional semiconductor materials are different from the semiconductor material included in the nanocrystal core. In certain embodiments, a shell can comprise two or more layers of the same or different semiconductor materials. In certain embodiments, a layer can include a single semiconductor material or a mixture of two or more semiconductor materials with different compositions, particle sizes, and/or emission characteristics. A semiconductor material may comprise a compound, a doped compound, and/or an alloy. A nanocrystal core surrounded by a shell is also referred to as having a "core/shell" structure.

In accordance with another aspect of the present invention, there is provided a method for forming a coating on at least a portion of a population of semiconductor nanocrystals, the method comprising: forming a first mixture including a population of semiconductor nanocrystals, one or more amine compounds, and a first solvent; adding one or more cation precursors and one or more anion precursors to the first mixture, wherein the temperature of the first mixture during addition of the precursors is sufficient for growing a semiconductor material comprising one or more of the cations and one or more of the anions on at least a portion of an outer surface of at least a portion of the population of semiconductor nanocrystals; and initiating addition of one or more acids to the first mixture after addition of the cation and anion precursors is initiated.

In certain embodiments, the one or more acids are added at a predetermined rate.

In certain embodiments, one or more acids are added to the first mixture as a solution further comprising a solvent.

In certain embodiments, at least one of the one or more acids comprises a phosphonic acid compound.

In certain embodiments, each of the one or more acids comprises a phosphonic acid compound.

In certain embodiments, one or more one of the acids comprises a phosphonic acid compound that further comprises one or more aromatic groups. In certain of such embodiments, the phosphonic acid compound further comprising one or more aromatic groups is added to the first mixture as a solution further comprising an aromatic solvent, such as, for example, but not limited to, diphenylbenzene, 1-dodecyl-2-pyrrolidinone, etc.

In certain embodiments, one or more one of the acids comprises a phosphonic acid compound that further comprises one or more aromatic groups and one or more of the amine compounds further comprises one or more aromatic groups.

In certain embodiments, one or more of the acids comprise a phosphonic acid compound that further comprises one or more alkyl groups. In certain of such embodiments, the phosphonic acid compound further comprising one or more alkyl groups is added to the first mixture as a solution further comprising a non-aromatic, non-coordinating or weakly coordinating solvent.

In certain embodiments, one or more one of the acids comprises a phosphonic acid compound that further comprises one or more alkyl groups and one or more of the amine compounds further comprises one or more alkyl groups.

In certain embodiments, a phosphonic acid compound comprises a ligand.

Examples of phopshonic acid compounds including, but are not limited to, benzylphosphonic acid, benzylphosphonic acid including at least one substituent group on the ring of the benzyl group, a conjugate base of such acids, and mixtures including one or more of the foregoing. In certain embodiments, a ligand comprises 4-hydroxybenzylphosphonic acid, a conjugate base of the acid, and a mixture of the foregoing. In certain embodiments, a phopshonic acid compounds comprises 3,5-di-tert-butyl-4-hydroxybenzylphosphonic acid, a conjugate base of the acid, or a mixture of the foregoing. Other examples include, but are not limited to, cyclohexylmethylphosphonic acid, phenylphosphonic acid, 2-methylbenzylphosphonic acid, 4-methoxybenzylphosphonic acid, 2-benzyloxyethyl phosphonic acid, 2-naphtalenylmethyl)phosphonic acid, benzylpyrophosphonic acid, etc.

In certain embodiments, at least one of the one or more acids comprises a carboxylic acid compound.

In certain embodiments, each of the one or more acids comprises a carboxylic acid compound.

In certain embodiments, a carboxylic acid compound comprises a ligand.

Examples of carboxylic acid compounds include, but are not limited to, $CH_3(CH_2)_nC(O)OH$ wherein n=1-18 (e.g., octanoic [caprylic] acid, nonanoic [pelargonic] acid, decanoic [capric] acid, undecanoic acid, dodecanoic [lauric] acid, tridecanoic acid, tetradecanoic [myristic] acid, pentadecanoic acid, hexadecanoic [palmitic] acid, heptadecanoic [margaric] acid, octadecanoic [stearic] acid, nonadecanoic acid, eicosanoic [arachidic] acid). In certain embodiments, a carboxylic acid compound comprises oleic acid. In certain embodiments, a carboxylic acid compound includes an aromatic group.

In certain embodiments, mixtures of different acids can be included.

In certain embodiments, the addition of the one or more acids is a stepwise addition.

In certain embodiments, the temperature is in a range from about 150° C. to about 350° C.

In certain embodiments, the temperature is in a range from about 150° C. to about 300° C.

In certain embodiments, the temperature is in a range from about 200° C. to about 250° C.

In certain embodiments, the temperature is about 250° C.

In certain embodiments, at least one of the one or more amine compounds comprises a primary amine.

In certain embodiments, each of the one or more amine compounds comprises a primary amine.

In certain embodiments, at least one of the one or more amine compounds comprises a secondary amine.

In certain embodiments, each of the one or more amine compounds comprises a secondary amine.

In certain embodiments, at least one of the one or more amine compounds comprises a tertiary amine.

In certain embodiments, each of the one or more amine compounds comprises a tertiary amine.

In certain embodiments including one or more amine compounds, a mixture of amines, (e.g., but not limited to, primary amines and secondary amines) can be included.

In certain embodiments, an amine compound comprises a ligand.

Examples of amine compounds include, but are not limited to, primary amines, e.g., $CH_3(CH_2)_nNH_2$ wherein n=4-19 (e.g., butylamine, pentylamine, hexylamine, heptylamine, octylamine, nonylamine, decylamine, undecylamine, dodecylamine, tridecylamine, tetradecylamine, pentadecylamine, hexadecylamine, heptadecylamine, octadecylamine, nonadecylamine, eicosylamine), and secondary amines, e.g., $(CH_3(CH_2)_n)_2NH$ wherein n=3-11 (e.g., dibutylamine, dipentylamine, dihexylamine, diheptylamine, dioctylamine, dinonylamine, didecylamine, didundecylamine, didodecylamine), etc. In certain embodiments, an amine comprises, for example, but not limited to, decylamine, octadecylamine, and oleylamine. Other nonlimiting examples include 2-ethylhexyl amine and ethanolamine. In certain embodiments, an amine compound comprises a phenyl alkyl amine (e.g., but not limited to, phenylbutyl amine). In certain embodiments, an amine compound comprises 4-phenylbutyl amine, 3,3-diphenylpropylamine, (2,3-diphenylpropyl)amine, etc. In certain embodiments, an amine compound comprises an aliphatic amine. In certain embodiments, an amine compound has a boiling point greater than 200° C. Other amines compounds can be readily ascertained by one of ordinary skill in the art.

In certain embodiments, the one or more cation precursors and one or more anion precursors are added separately.

In certain embodiments, the one or more cation precursors are added separately from the one or more anion precursors.

In certain embodiments, the one or more cation precursors and one or more anion precursors are added concurrently.

In certain embodiments, the addition of the one or more cation precursors and the one or more anion precursors is a stepwise addition.

In certain embodiments, the one or more cation precursors and one or more anion precursors are added at a predetermined rate.

In certain embodiments, the one or more cation precursors are included in a solution further including a solvent.

In certain embodiments, the one or more anion precursors are included in a solution further comprising a solvent.

In certain embodiments, semiconductor nanocrystal core particles prepared according to methods described herein can be provided with a coating, layer or shell by forming a mixture including such semiconductor nanocrystals core particles, one or more amine compounds, and a solvent. One or more overcoat cation precursors and one or more overcoat anion precursors are added to the mixture, wherein the temperature of the mixture during addition is sufficient to form an overcoat material comprising one or more cations and one or more anions on a surface of at least a portion of the semiconductor nanocrystal core particles. The addition of one or more acids, such as phosphonic acids or carboxylic acids, may be initiated to the mixture after addition of the overcoat cation and overcoat anion precursors is initiated. In certain of such embodiments, the temperature of the mixture is in a range from about 150° C. to about 350° C. In certain of such embodiments, the temperature of the mixture is in a range from about 150° C. to about 300° C. In certain of such embodiments, the temperature of the mixture is in a range from about 200° C. to about 250° C.

Examples of solvents include, but are not limited to, octadecene, squalene, methyl myristate, octyl octanoate, hexyl octanoate, and $CH_3(CH_2)_nC(O)O(CH_2)_mCH_3$ wherein n=4-18 and m=1-8, dioctyl ether, and diphenyl ether, and mixtures of one or more solvents. In certain embodiments, a mixture can comprise a mixture, (including but not limited to a eutectic mixture) of biphenyl and diphenyl oxide, including, e.g., DOWTHERM A, available from the Dow Chemical Company. Other high boiling point ethers (e.g., BP>~200° C.) may also be used. Such ethers (coordinating) can be aromatic ethers, aliphatic ethers or aromatic aliphatic ethers. Examples of additional ethers include, but are not limited to, dihexyl ether, diethyleneglycol dimethyl ether, diethyleneglycol dibutyl ether, triethyleneglycol dimethyl ether, tetraethyleneglycol dimethyl ether, butyl phenyl ether, benzyl phenyl ether, dibenzyl ether, ditolyl ether and isomers thereof. Mixtures of two or more solvents can also be used. Other coordinating solvents can be readily ascertained by one of ordinary skill in the art.

Examples of non-coordinating solvents for use in the methods taught herein include, but are not limited to, squalane, octadecane, or any other saturated hydrocarbon molecule. Mixtures of two or more solvents can also be used. Other non-coordinating solvents for use in the methods taught herein can be readily ascertained by one of ordinary skill in the art. In certain embodiments, non-coordinating solvents comprise liquids having a dipole moment in the range form 0 to about 0.2 μ/D. In certain embodiments, weakly coordinating solvents can be used. In certain embodiments, weakly coordinating solvents comprise liquids having a dipole moment in the range from 0.2 to 0.7 μ/D.

In certain embodiments including a phosphonic acid compound further including one or more aromatic groups, the first solvent can comprise an aromatic solvent. Examples of aromatic solvents include, but are not limited to, tri-phenyl phosphine oxide, tri-phenyl phosphine, o-terphenyl, m-terphenyl, and p-terphenyl, etc. Other aromatic solvents with a boiling point greater than 250° C. that will not react with the semiconductor nanocrystals or ligands can also be identified by one of ordinary skill in the art.

In certain embodiments including a phosphonic acid compound further including one or more alkyl groups, the first solvent can comprise squalane, TOP, other aliphatic solvents, etc.

In certain preferred embodiments, a phosphonic acid compound comprising benzyl phosphonic acid and an amine compound comprising phenylbutyl amine are used. In certain of such embodiments, the first solvent comprises a mixture of o-terphenyl and squalane in a 4:1 weight percent ratio.

In another embodiment, a phosphonic acid compound comprising octadecyl phosphonic acid and an amine compound comprising decyl amine are used. In certain of such embodiments, the first solvent comprises TOP or squalane or other aliphatic solvent.

Examples of semiconductor materials for inclusion in a shell include, but are not limited to, a semiconductor material comprising one or more elements of Group II and one or more elements of Group VI (e.g., binary, ternary, and quaternary II-VI compositions). Other non-limiting examples of semiconductor materials include a semiconductor material comprising one or more elements of Group III and one or more elements of Group V (e.g., binary, ternary, and quaternary III-V compositions), Group IV-VI compounds (e.g., binary, ternary, and quaternary compositions), Group I-III-VI compounds (e.g., binary, ternary, and quaternary compositions), Group II-IV-VI compounds (e.g., binary, ternary, and quaternary compositions), Group II-IV-V compounds (e.g., binary, ternary, and quaternary compositions), Group IV elements, an alloy including any of the foregoing, and/or a mixture including any of the foregoing.

Shell thickness can be varied by growing a desired thickness of the shell. For example, the shell can have a thickness less than about one monolayer, about one monolayer, or more than about one monolayer. Preferably, the thickness is less than that at which quantum confinement is not achieved. The thickness is selected to achieve the predetermined characteristics of the core/shell nanocrystal. In certain embodiments, the thickness is in the range from greater than about 0 to about 20 monolayers. In certain embodiments, the thickness is in the range from greater than about 0 to about 10 monolayers. In certain embodiments, the thickness is in the range from greater than about 0 to about 5 monolayers. In certain embodiments, the thickness is in the range from about 1 to about 5 monolayers. In certain embodiments, the thickness is in the range from about 3 to about 5 monolayers. In certain embodiments, more than 20 monolayers can be grown.

In certain embodiments, a nanocrystal includes a shell formed over at least a portion, and preferably all, of the outer surface thereof.

In certain embodiments, the nanocrystal is isolated from the reaction mixture. In certain embodiments, isolated nanocrystals are purified before the shell is formed.

In certain embodiments, the shell can be formed over at least a portion of the core with prior isolation and/or purification of the core. In certain embodiments of the latter case, the formation of the shell can be carried out in the same reaction vessel in which the core is formed.

In certain embodiments, a nanocrystal further includes one or more ligands attached to the surface of the nanocrystal.

In certain embodiments, a nanocrystal core, and/or a nanocrystal shell comprises a colloidal growth process. Colloidal growth occurs by injection a cation precursor and an anion precursor into a solvent at a first temperature. This permits discrete nucleation and results in the controlled growth of macroscopic quantities of nanocrystals. The injection produces a nucleus that can be grown in a controlled manner to form a nanocrystal. The reaction mixture can be subjected to a second higher temperature to grow and anneal the nanocrystal. Both the average size and the size distribution of the nanocrystals in a sample are dependent on the growth temperature. The growth temperature necessary to maintain steady growth increases with increasing average crystal size. The nanocrystal is a member of a population of nanocrystals. As a result of the discrete nucleation and controlled growth, the population of nanocrystals that can be obtained has a narrow, monodisperse distribution of particle sizes. The monodisperse distribution of particles can also be referred to as a size. Preferably, a monodisperse population of particles includes a population of particles wherein at least about 60% of the particles in the population fall within a specified particle size range. A population of monodisperse particles preferably deviate less than 15% rms (root-mean-square) in particle size and more preferably less than 10% rms and most preferably less than 5%.

A narrow size distribution of the nanocrystals comprising semiconductor material allows the possibility of light emission in narrow spectral widths. Monodisperse semiconductor nanocrystals have been described in detail in Murray et al. (J. Am. Chem. Soc., 115:8706 (1993)) which is hereby incorporated herein by reference in its entirety.

The process of controlled growth and annealing of nanocrystals in a solvent that follows nucleation can also result in uniform surface derivatization and regular structures. As the size distribution sharpens, the temperature can be raised to maintain steady growth. By adding more cation precursor or anion precursor, the growth period can be shortened. As mentioned above, a cation precursor can be an inorganic compound, an organometallic compound, or elemental metal. For example, in preparing a semiconductor material represented by the general formula MX, wherein the semiconductor material comprises one or more Group III cation precursors (represented by M in the above general formula) comprises one or more of boron, aluminum, gallium, indium, and thallium. Additional chemical elements can optionally be further included. In preparing other semiconductor materials, the cation precursor is selected based on the composition of the desired semiconductor material. The anion precursor is a compound capable of reacting with the cation precursor to form a material with the general formula MX. For example, in preparing a semiconductor material comprising a Group V, element, X comprises one or more of nitrogen, phosphorus, arsenic, antimony, or bismuth. In preparing other semiconductor materials, X is selected based on the composition of the desired semiconductor material.

Size distribution during the growth stage of the reaction can be estimated by monitoring the absorption or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals as well as to sharpen size distribution. For example, by stopping growth at a particular semiconductor nanocrystal average diameter, a population having an average semiconductor nanocrystal diameter of less than 150 Å can be obtained. A population of nanocrystals can have an average diameter of 15 Å to 125 Å. In addition, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm.

Optionally, the particle size distribution of the nanocrystals can be further refined by size selective precipitation with a poor solvent for the nanocrystals, such as, for example, methanol/butanol. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population preferably has no more than a 15% rms deviation from mean particle size, more preferably 10% rms deviation or less, and most preferably 5% rms deviation or less.

In certain embodiments, the nanocrystal emission includes a maximum peak emission with a full width at half maximum (FWHM) of not more than 70 nm, not more than 60 nm, not more than 50 nm.

Transmission electron microscopy (TEM) can provide information about the size, shape, and distribution of the semiconductor nanocrystal population. Powder X-ray diffraction (XRD) patterns can provide the most complete information regarding the type and quality of the crystal structure of the semiconductor nanocrystals. Estimates of size are also possible since particle size is inversely related, via the X-ray coherence length, to the peak width. For example, the diameter of the semiconductor nanocrystal can be measured directly by transmission electron microscopy or estimated from X-ray diffraction data using, for example, the Scherrer equation. It also can be estimated from the UV/Vis absorption spectrum.

As discussed herein, nanocrystals preferably have ligands attached thereto. Examples of ligands include, but are not limited to, fatty acids and other carboxylic acid compounds, phosphonic acid compounds, amine compounds, phosphines, phosphine oxides, etc.

In certain embodiments, the reaction is carried out in an inert atmosphere, where exposure to air is substantially, and preferably completely, precluded.

Quantum dots in accordance with the present invention can be included in various formulations depending upon the desired utility. According to one aspect, quantum dots are included in flowable formulations or liquids to be included, for example, into clear vessels which are to be exposed to light. Such formulations can include various amounts of one or more type of quantum dots and one or more host materials. Such formulations can further include one or more scatterers. Other optional additives or ingredients can also be included in a formulation. In certain embodiments, a formulation can further include one or more photo initiators. One of skill in the art will readily recognize from the present invention that additional ingredients can be included depending upon the particular intended application for the quantum dots.

An optical material, other composition, or formulation within the scope of the invention may include a host material, such as in the case of an optical component, which may be present in an amount from about 50 weight percent and about 99.5 weight percent, and any weight percent in between whether overlapping or not. In certain embodiment, a host material may be present in an amount from about 80 to about 99.5 weight percent. Examples of specific useful host materials include, but are not limited to, polymers, oligomers, monomers, resins, binders, glasses, metal oxides, and other nonpolymeric materials. Preferred host materials include polymeric and non-polymeric materials that are at least partially transparent, and preferably fully transparent, to preselected wavelengths of light. In certain embodiments, the preselected wavelengths can include wavelengths of light in the visible (e.g., 400-700 nm) region of the electromagnetic spectrum. Preferred host materials include crosslinked polymers and solvent-cast polymers. Examples of other preferred host materials include, but are not limited to, glass or a transparent resin. In particular, a resin such as a non-curable resin, heat-curable resin, or photocurable resin is suitably used from the viewpoint of processability. Specific examples of such a resin, in the form of either an oligomer or a polymer, include, but are not limited to, a melamine resin, a phenol resin, an alkyl resin, an epoxy resin, a polyurethane resin, a maleic resin, a polyamide resin, polymethyl methacrylate, polyacrylate, polycarbonate, polyvinyl alcohol, polyvinylpyrrolidone, hydroxyethylcellulose, carboxymethylcellulose, copolymers containing monomers or oligomers forming these resins, and the like. Other suitable host materials can be identified by persons of ordinary skill in the relevant art.

Host materials can also comprise silicone materials. Suitable host materials comprising silicone materials can be identified by persons of ordinary skill in the relevant art.

In certain embodiments and aspects of the inventions contemplated by this invention, a host material comprises a photocurable resin. A photocurable resin may be a preferred host material in certain embodiments, e.g., in embodiments in which the composition is to be patterned. As a photocurable resin, a photo-polymerizable resin such as an acrylic acid or methacrylic acid based resin containing a reactive vinyl group, a photo-crosslinkable resin which generally contains a photo-sensitizer, such as polyvinyl cinnamate, benzophenone, or the like may be used. A heat-curable resin may be used when the photo-sensitizer is not used. These resins may be used individually or in combination of two or more.

In certain embodiments and aspects of the inventions contemplated by this invention, a host material can comprise a solvent-cast resin. A polymer such as a polyurethane resin, a maleic resin, a polyamide resin, polymethyl methacrylate, polyacrylate, polycarbonate, polyvinyl alcohol, polyvinylpyrrolidone, hydroxyethylcellulose, carboxymethylcellulose, copolymers containing monomers or oligomers forming these resins, and the like can be dissolved in solvents known to those skilled in the art. Upon evaporation of the solvent, the resin forms a solid host material for the semiconductor nanoparticles.

In certain embodiments, acrylate monomers and/or acrylate oligomers which are commercially available from Radcure and Sartomer can be preferred.

Quantum dots can be encapsulated. Nonlimiting examples of encapsulation materials, related methods, and other information that may be useful are described in International Application No. PCT/US2009/01372 of Linton, filed 4 Mar. 2009 entitled "Particles Including Nanoparticles, Uses Thereof, And Methods" and U.S. Patent Application No. 61/240,932 of Nick et al., filed 9 Sep. 2009 entitled "Particles Including Nanoparticles, Uses Thereof, And Methods", each of the foregoing being hereby incorporated herein by reference in its entirety.

The total amount of quantum dots included in an optical material, such as a host material for example a polymer matrix, within the scope of the invention is preferably in a range from about 0.05 weight percent to about 5 weight percent, and any weight percent in between whether overlapping or not. The amount of quantum dots included in an optical material can vary within such range depending upon the application and the form in which the quantum dots are included (e.g., film, optics (e.g., capillary), encapsulated film, etc.), which can be chosen based on the particular end application. For instance, when an optic material is used in a thicker capillary with a longer pathlength (e.g., such as in a backlight unit (BLU) for large screen television applications), the concentration of quantum dots can be closer to 0.5%. When an optical material is used in a thinner capillary with a shorter pathlength (e.g., such as in BLUs for mobile or hand-held applications), the concentration of quantum dots can be closer to 5%.

The quantum dots used in a formulation, optical material, or other composition are selected based on the desired peak emission wavelength or combinations of wavelengths described for the particular intend end-use application for the formulation, optical material, or other composition.

When quantum dots that emit light with peak emission wavelengths that differ from that of other quantum dots included in a particular embodiments, the amounts of each are selected based on the desired light out-put. Such determination can be readily made by the person of ordinary skill in the relevant art. For example, the ratio of quantum dots with different peak emissions that are used in an optical material is determined by the emission peaks of the quantum dots used. For example, when quantum dots capable of emitting green light having a peak center wavelength in a range from about 514 nm to about 545 nm, and any wavelength in between whether overlapping or not, and quantum dots capable of emitting red light having a peak center wavelength in a range from about 615 nm to about 645 nm, and any wavelength in between whether overlapping or not, are used in an optical material, the ratio of the weight percent green-emitting quantum dots to the weight percent of red-emitting quantum dots can be in a range from about 12:1 to about 1:1, and any ratio in between whether overlapping or not.

The above ratio of weight percent green-emitting quantum dots to weight percent red-emitting quantum dots in an optical material can alternatively be presented as a molar ratio. For example, the above weight percent ratio of green to red quantum dots range can correspond to a green to red quantum dot molar ratio in a range from about 24.75 to 1 to about 5.5 to 1, and any ratio in between whether overlapping or not.

The ratio of the blue to green to red light output intensity in white trichromatic light emitted by a quantum dot containing BLU described herein including blue-emitting solid state inorganic semiconductor light emitting devices (having blue light with a peak center wavelength in a range from about 450 nm to about 460 nm, and any wavelength in between whether overlapping or not), and an optical material including mixtures of green-emitting quantum dots and red-emitting quantum dots within the above range of weight percent ratios can vary within the range. For example, the ratio of blue to green light output intensity therefor can be in a range from about 0.75 to about 4 and the ratio of green to red light output intensity therefor can be in a range from about 0.75 to about 2.0. In certain embodiments, for example, the ratio of blue to green light output intensity can be in a range from about 1.4 to about 2.5 and the ratio of green to red light output intensity can be in a range from about 0.9 to about 1.3.

Scatterers, also referred to as scattering agents, within the scope of the invention may be present, for example, in an amount of between about 0.01 weight percent and about 1 weight percent. Amounts of scatterers outside such range may also be useful. Examples of light scatterers (also referred to herein as scatterers or light scattering particles) that can be used in the embodiments and aspects of the inventions described herein, include, without limitation, metal or metal oxide particles, air bubbles, and glass and polymeric beads (solid or hollow). Other light scatterers can be readily identified by those of ordinary skill in the art. In certain embodiments, scatterers have a spherical shape. Preferred examples of scattering particles include, but are not limited to, $TiO_2$, $SiO_2$, $BaTiO_3$, $BaSO_4$, and ZnO. Particles of other materials that are non-reactive with the host material and that can increase the absorption pathlength of the excitation light in the host material can be used. In certain embodiments, light scatterers may have a high index of refraction (e.g., $TiO_2$, $BaSO_4$, etc) or a low index of refraction (gas bubbles).

Selection of the size and size distribution of the scatterers is readily determinable by those of ordinary skill in the relevant art. The size and size distribution can be based upon the refractive index mismatch of the scattering particle and the host material in which the light scatterers are to be dispersed, and the preselected wavelength(s) to be scattered according to Rayleigh scattering theory. The surface of the scattering particle may further be treated to improve dispersability and stability in the host material. In one embodiment, the scattering particle comprises $TiO_2$ (R902+from DuPont) of 0.2 μm particle size, in a concentration in a range from about 0.01 to about 1% by weight.

The amount of scatterers in a formulation is useful in applications where the ink is contained in a clear vessel having edges to limit losses due the total internal reflection. The amount of the scatterers may be altered relative to the amount of quantum dots used in the formulation. For example, when the amount of the scatter is increased, the amount of quantum dots may be decreased.

Examples of thixotropes which may be included in a quantum dot formulation, also referred to as rheology modifiers, include, but are not limited to, fumed metal oxides (e.g., fumed silica which can be surface treated or untreated (such as Cab-O-Sil® fumed silica products available from Cabot Corporation), fumed metal oxide gels (e.g., a silica gel). An optical material can include an amount of thixotrope in a range from about 5 to about 12 weight percent. Other amounts outside the range may also be determined to be useful or desirable.

In certain embodiments, a formulation including quantum dots and a host material can be formed from an ink comprising quantum dots and a liquid vehicle, wherein the liquid vehicle comprises a composition including one or more functional groups that are capable of being cross-linked The functional units can be cross-linked, for example, by UV treatment, thermal treatment, or another cross-linking technique readily ascertainable by a person of ordinary skill in a relevant art. In certain embodiments, the composition including one or more functional groups that are capable of being cross-linked can be the liquid vehicle itself. In certain embodiments, it can be a co-solvent. In certain embodiments, it can be a component of a mixture with the liquid vehicle.

One particular example of a preferred method of making an ink is as follows. A solution including quantum dots having the desired emission characteristics well dispersed in an organic solvent is concentrated to the consistency of a wax by first stripping off the solvent under nitrogen/vacuum until a quantum dot containing residue with the desired consistency is obtained. The desired resin monomer is then added under nitrogen conditions, until the desired monomer to quantum dot ratio is achieved. This mixture is then vortex mixed under oxygen free conditions until the quantum dots are well dispersed. The final components of the resin are then added to the quantum dot dispersion, and are then sonicated mixed to ensure a fine dispersion.

A tube or capillary comprising an optical material prepared from such finished ink can be prepared by then introducing the ink into the tube via a wide variety of methods, and then UV cured under intense illumination for some number of seconds for a complete cure.

In certain aspects and embodiments of the inventions taught herein, the optic including the cured quantum dot containing ink is exposed to light flux for a period of time sufficient to increase the photoluminescent efficiency of the optical material.

In certain embodiments, the optical material is exposed to light and heat for a period of time sufficient to increase the photoluminescent efficiency of the optical material.

In preferred certain embodiments, the exposure to light or light and heat is continued for a period of time until the photoluminescent efficiency reaches a substantially constant value.

In one embodiment, for example, after the optic, i.e. tube or capillary, is filled with quantum dot containing ink, cured, and sealed (regardless of the order in which the curing and sealing steps are conducted), the optic is exposed, to 25-35 mW/cm$^2$ light flux with a wavelength in a range from about 365 nm to about 470 nm, while at a temperature of in a range from about 25 to 80° C., for a period of time sufficient to increase the photoluminescent efficiency of the ink In one embodiment, for example, the light has a wavelength of about 450 nm, the light flux is 30 mW/cm$^2$, the temperature 80° C., and the exposure time is 3 hours.

In general, quantum dots according to the present invention can have an average particle size in a range from about 1 to about 1000 nanometers (nm), and preferably in a range from about 1 to about 100 nm. In certain embodiments, quantum dots have an average particle size in a range from about 1 to about 20 nm (e.g., such as about 5, 6, 7, 8, 9, 10, 11, 12, 13, 14, 15, 16, 17, 18, 19, or 20 nm). In certain embodiments, quantum dots have an average particle size in a range from about 1 nm to about 20 nm or about 1 nm to about 10 nm. Quantum dots can have an average diameter less than about 150 Angstroms (Å). In certain embodiments, quantum dots having an average diameter in a range from about 12 to about 150 Å can be particularly desirable. However, depending upon the composition, structure, and desired emission wavelength of the quantum dot, the average diameter may be outside of these ranges.

The particle size distribution of the quantum dots (including, e.g., semiconductor nanocrystals) can be further refined by size selective precipitation with a poor solvent for the quantum dots, such as methanol/butanol. For example, quantum dots can be dispersed in a solution of 10% butanol in hexane. Methanol can be added drop wise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected quantum dot (e.g., semiconductor nanocrystal) population preferably has no more than a 15% rms deviation from mean diameter, more preferably 10% rms deviation or less, and most preferably 5% rms deviation or less.

According to one aspect, a formulation or composition includes a host material that is photopolymerizable. The formulation or composition in the form of a fluid can be placed within the tube or other container and then one or both ends sealed with the tube being hermetically sealed to avoid oxygen being within the tube. Alternatively, the formulation or composition can be disposed between opposing plates and/or sheets with the perimeter edges being hermetically sealed. Quantum dots may be present in the polymerizable composition in an amount from about 0.05% w/w to about 5.0% w/w. According to one aspect, the polymerizable composition is photopolymerizable. The polymerizable composition is in the form of a fluid which can be placed within the tube and then one or both ends sealed with the tube being hermetically sealed to avoid oxygen being within the tube. The polymerizable composition is then subjected to light of sufficient intensity and for a period of time sufficient to polymerize the polymerizable composition, and in one aspect, in the absence of oxygen. In certain embodiments, the period of time can range between about 10 seconds to about 6 minutes or between about 1 minute to about 6 minutes. According to one embodiment, the period of time is sufficiently short to avoid agglomeration of the quantum dots prior to formation of a polymerized matrix. Agglomeration can result in FRET and subsequent loss of photoluminescent performance.

A host material can include a combination of one or more polymerizable host materials. A polymer or matrix in which quantum dots are dispersed is an example of a host material. Host materials include polymeric and non-polymeric materials that are at least partially transparent, and preferably fully transparent, to preselected wavelengths of light.

According to an additional aspect, a polymerizable host material is selected so as to provide sufficient ductility to the polymerized matrix. Ductility can be advantageous in relieving stress on thin walled glass tubes that can occur during polymer shrinkage when the polymer matrix is cured. Suitable polymerizable materials can act as solvents for the quantum dots and so combinations of polymerizable host materials can be selected based on solvent properties for various quantum dots.

Polymerizable host materials include monomers and oligomers and polymers and mixtures thereof. Exemplary monomers include lauryl methacrylate, norbornyl methacrylate, ebercyl 150 (Cytec), CD590 (Cytec) and the like. Polymerizable materials can be present in the polymerizable formulation in an amount greater than 50 weight percent. Examples include amounts in a range greater than 50 to about 99.5 weight percent, greater than 50 to about 98 weight percent, greater than 50 to about 95 weight percent, from about 80 to about 99.5 weight percent, from about 90 to about 99.95 weight percent, from about 95 to about 99.95 weight percent. Other amounts outside these examples may also be determined to be useful or desirable.

Exemplary polymerizable compositions further include one or more of a crosslinking agent, a scattering agent, a rheology modifier, a filler, and a photoinitiator.

Suitable crosslinking agents include ethylene glycol dimethacrylate ebercyl 150 and the like. Crosslinking agents can be present in the polymerizable formulation in an amount between about 0.5 wt % and about 3.0 wt %. Crosslinking agents are generally added, for example in an amount of 1% w/w, to improve stability and strength of a polymer matrix which helps avoid cracking of the matrix due to shrinkage upon curing of the matrix.

Suitable scattering agents include $TiO_2$, alumina, barium sulfate, PTFE, barium titantate and the like. Scattering agents can be present in the polymerizable formulation in an amount between about 0.05 wt % and about 1.0 wt %. Scattering agents are generally added, for example in a preferred amount of about 0.15% w/w, to promote outcoupling of emitted light.

Suitable rheology modifiers (thixotropes) include fumed silica commercially available from Cabot Corporation such as TS-720 treated fumed silica, treated silica commercially available from Cabot Corporation such as TS720, TS500, TS530, TS610 and hydrophilic silica such as M5 and EHS commercially available from Cabot Corporation. Rheology modifiers can be present in the polymerizable formulation in an amount between about 5% w/w to about 12% w/w. Rheology modifiers or thixotropes act to lower the shrinkage of the matrix resin and help prevent cracking. Hydrophobic rheology modifiers disperse more easily and build viscosity at higher loadings allowing for more filler content and less shrinkage to the point where the formulation becomes too viscous to fill the tube. Rheology modifiers such as fumed silica also provide higher EQE and help to prevent settling of $TiO_2$ on the surface of the tube before polymerization has taken place.

Suitable fillers include silica, fumed silica, precipitated silica, glass beads, PMMA beads and the like. Fillers can be present in the polymerizable formulation in an amount between about 0.01% and about 60%, about 0.01% and about 50%, about 0.01% and about 40%, about 0.01% and about 30%, about 0.01% and about 20% and any value or range in between whether overlapping or not.

Suitable photoinitiators include Irgacure 2022, KTO-46 (Lambert), Esacure 1 (Lambert) and the like. Photoinitiators can be present in the polymerizable formulation in an amount between about 1% w/w to about 5% w/w. Photoinitiators generally help to sensitize the polymerizable composition to UV light for photopolymerization.

Additional information that may be useful in connection with the present invention and the inventions described herein is included in International Application No. PCT/US2009/002796 of Coe-Sullivan et al, filed 6 May 2009, entitled "Optical Components, Systems Including An Optical Component, And Devices"; International Application No. PCT/US2009/002789 of Coe-Sullivan et al, filed 6 May 2009, entitled: "Solid State Lighting Devices Including Quantum Confined Semiconductor Nanoparticles, An Optical Component For A Solid State Light Device, And Methods"; International Application No. PCT/US2010/32859 of Modi et al, filed 28 Apr. 2010 entitled "Optical Materials, Optical Components, And Methods"; International Application No. PCT/US2010/032799 of Modi et al, filed 28 Apr. 2010 entitled "Optical Materials, Optical Components, Devices, And Methods"; International Application No. PCT/US2011/047284 of Sadasivan et al, filed 10 Aug. 2011 entitled "Quantum Dot Based Lighting"; International Application No. PCT/US2008/007901 of Linton et al, filed 25 Jun. 2008 entitled "Compositions And Methods Including Depositing Nanomaterial"; U.S. patent application Ser. No. 12/283,609 of Coe-Sullivan et al, filed 12 Sep. 2008 entitled "Compositions, Optical Component, System Including An Optical Component, Devices, And Other Products"; each of the foregoing being hereby incorporated herein by reference in its entirety.

In accordance with a still further aspect of the present invention, there is provided an optical material comprising at least one quantum dot described herein.

In accordance with a still further aspect of the present invention, there is provided a light emitting material comprising at least one quantum dot described herein.

In accordance with a still further aspect of the present invention, there is provided an optical component including at least one quantum dot described herein.

In accordance with a still further aspect of the present invention, there is provided a backlighting unit including at least one quantum dot described herein.

In accordance with a still further aspect of the present invention, there is provided a display including at least one quantum dot described herein.

In accordance with a still further aspect of the present invention, there is provided an electronic device including at least one quantum dot described herein.

In accordance with a still further aspect of the present invention, there is provided an opto-electronic device including at least one quantum dot described herein.

In accordance with a still further aspect of the present invention, there is provided light-emitting device including at least one quantum dot described herein.

In accordance with a still further aspect of the present invention, there is provided a lamp including at least one quantum dot described herein.

In accordance with a still further aspect of the present invention, there is provided a light bulb including at least one quantum dot described herein.

In accordance with a still further aspect of the present invention, there is provided a luminaire including at least one quantum dot described herein.

In accordance with yet another aspect of the present invention, there is provided a population of quantum dots including at least on quantum dot described herein. In certain embodiments, the light emitting by the population has a peak emission at a predetermined wavelength with an FWHM less than about 60 nm. In certain embodiments, the FWHM is in a range from about 15 to about 50 nm.

In accordance with yet another aspect of the present invention, there is provided a population of quantum dots prepared in accordance with any of the methods described herein. In certain embodiments, the light emitting by the population has a peak emission at a predetermined wavelength with an FWHM less than about 60 nm. In certain embodiments, the FWHM is in a range from about 15 to about 50 nm.

In accordance with a still further aspect of the present invention, there is provided a composition including at least one quantum dot prepared in accordance with any of the methods described herein. In certain embodiments, the composition further includes a host material.

In accordance with a still further aspect of the present invention, there is provided an optical material comprising at least one quantum dot prepared in accordance with any of the methods described herein.

In accordance with a still further aspect of the present invention, there is provided a light emitting material comprising at least one quantum dot prepared in accordance with any of the methods described herein.

In accordance with a still further aspect of the present invention, there is provided an optical component including at least one quantum dot prepared in accordance with any of the methods described herein.

In accordance with a still further aspect of the present invention, there is provided a backlighting unit including at least one quantum dot prepared in accordance with any of the methods described herein.

In accordance with a still further aspect of the present invention, there is provided a display including at least one quantum dot prepared in accordance with any of the methods described herein.

In accordance with a still further aspect of the present invention, there is provided an electronic device including at least one quantum dot prepared in accordance with any of the methods described herein.

In accordance with a still further aspect of the present invention, there is provided an opto-electronic device including at least one quantum dot prepared in accordance with any of the methods described herein.

In accordance with a still further aspect of the present invention, there is provided light-emitting device including at least one quantum dot prepared in accordance with any of the methods described herein.

In accordance with a still further aspect of the present invention, there is provided a lamp including at least one quantum dot prepared in accordance with any of the methods described herein.

In accordance with a still further aspect of the present invention, there is provided a light bulb including at least one quantum dot prepared in accordance with any of the methods described herein.

In accordance with a still further aspect of the present invention, there is provided a luminaire including at least one quantum dot prepared in accordance with any of the methods described herein.

In certain embodiments of the various aspects and embodiments of the inventions described herein, the quantum dot core and shells are undoped.

In certain embodiments of the various aspects and embodiments of the inventions described herein, a quantum dot described herein can be included in a device, component, or product in the form of a composition in which it is included.

The present invention will be further clarified by the following non-limiting examples, which are intended to be exemplary of the present invention.

EXAMPLES

Example 1

Preparation of Semiconductor Nanocrystals Using a Premix-injection Method

Under air, a 50 ml 3-neck round bottom flask is charged with a Teflon coated magnetic stir bar, myristic acid (1.080 g, 2.5 eq relative to In) and 1-octadecene (30 ml). A thermocouple with a teflon adapter, an air reflux condenser attached to a Schlenk line by an adapter, and a rubber septum are attached to the 3 necks of the flask respectively. The flask is evacuated and heated to 80° C. by a heating mantle attached to a temperature controller. the flask is evacuated for 1 hour under constant stirring.

In a glove box, trimethylindium (0.300 mg, 1.875 mmol), Dowtherm A (4 ml) and tris(trimethylsilyl)phosphine (0.234 mg, 0.276 ml, 0.933 mol) are added to a dry vial. The solution is stirred with the tip of a needle until all component are dissolved. The solution is loaded into a 5 ml syringe.

Dioctylamine (0.900 ml) is loaded into a 2 ml syringe. Both syringes are kept in a nitrogen filled bag until immediately before use.

The flask is backfilled with nitrogen and heated to 125° C. When the temperature stabilizes, the contents of the 5 ml syringe are swiftly injected into the flask at a high stirring rate. This results in a light yellow solution. After 7 minutes, the dioctylamine is injected. After 23 minutes, the flask is heated to 170° C. The solution is heated for an additional 2 hours and then cooled to room temperature. The contents are transferred to two nitrogen filled 40 ml vials by canuule transfer.

In a glove box, the growth solution is split equally between three 50 ml centrifuge tubes. Isopropanol (dry, degassed, 30 ml) is added to each tube. Methanol (dry, degassed, 10 ml) is added to each tube resulting in a dark red oil. After vigorous shaking, the tubes are centrifuged at 4000 rpm for 3 minutes. The supernatant is decanted from the oil. Butanol (dry, degassed, 5 ml) is added to each tube resulting in a dark red solid. The tubes are centrifuged at 4000 rpm for 3 minutes. The supernatant is decanted. Hexane (dry degassed, 5 ml) is added to one of the tubes to disperse all solids. The hexane suspension is filtered through a 0.2 micron syringe filter and stored in a 20 ml vial.

FIG. 1 is a graph of absorbance versus wavelength for semiconductor nanocrystals produced by the method of Example 1.

Example 2

Preparation of Semiconductor Nanocrystals Using Separate Injection of Precursors A solution of myristic acid (0.360 g) in 10 ml of 1-octadecene is degassed at 80° C. for 1 hour in a 50 ml 3 neck flask. A precursor solution of trimethylindium (100 mg) in 3 ml of 1-octadecene is prepared and placed in a syringe. A precursor solution of tris(trimethylsilyl)phosphine (80 mg) in 1 ml of 1-octadecene is prepared and placed in a syringe.

After 1 hour, the solution is backfilled with nitrogen and heated to 125° C. The precursor solution of tris(trimethylsilyl)phosphine is injected into the flask and stirred for 1 minute. Then the precursor solution of trimethylindium is injected into the flask and stirred for 6 minutes. At 7 minutes of total reaction time, 0.33 ml of dioctyl amine is added and stirred at 125° C. for 23 minutes for a total reaction time of 30 minutes. The temperature is then increased to 170° C. and maintained at 170° C. for 2 hours. The flask is then cooled to room temperature and transferred to a dry box. The reaction solution (about 14 ml) is placed into a 45 ml centrifuge tube. 30 ml of a 3:1 solution of isopropanol:methanol is added to the centrifuge tube. The centrifuge tube is centrifuged for 5 minutes at 4000 rpm. The supernatant is decanted from the oil. Butanol (dry, degassed, 5 ml) is added to the tube resulting in a dark red solid. The tubes are centrifuged at 4000 rpm for 3 minutes. The supernatant is decanted. Hexane (dry degassed, 5 ml) is added to one of the tubes to disperse all solids. The hexane suspension is filtered through a 0.2 micron syringe filter and stored in a 20 ml vial.

Figure 2:
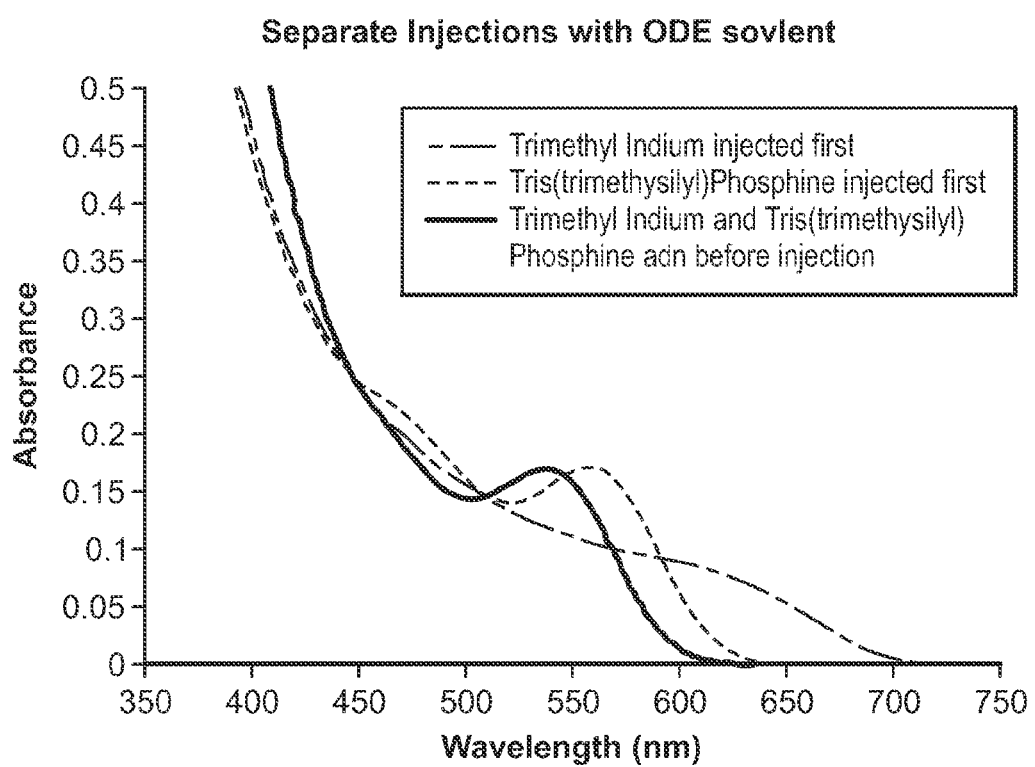
FIG. 2 is a graph of absorbance versus wavelength.

FIG. 2 is a graph of absorbance versus wavelength for semiconductor nanocrystals produced by the method of Example 2. The curves illustrate that size and size distribution can be affected by order of addition of precursors.

Example 3

Preparation of Semiconductor Nanocrystals Using Separate Injection of Precursors A solution of stearic acid (1.4 g) in 100 ml of 1-octadecene is degassed at 80° C. for 1 hour in a 500 ml 3 neck flask.

A precursor solution of trimethylindium (300 mg) in 30 ml of 1-octadecene is prepared and placed in a syringe. A precursor solution of tris(trimethylsilyl)phosphine (300 mg) in 10 ml of 1-octadecene is prepared and placed in a syringe.

After 1 hour, the solution is backfilled with nitrogen and heated to 125° C. The precursor solution of tris(trimethylsilyl)phosphine is injected into the flask and stirred for 1 minute. Then the precursor solution of trimethylindium is injected into the flask and stirred for 6 minutes. At 7 minutes of total reaction time, 3.3 ml of dioctyl amine is added and stirred at 125° C. for 23 minutes for a total reaction time of 30 minutes. The temperature is then increased to 250° C. and maintained at 250° C. for 2 hours. The flask is then cooled to room temperature and transferred to a dry box. Semiconductor nanocrystals are recovered according to the method of Example 1. Semiconductor nanocrystals made according to the method of Example 3 have a HWHM of 25-30 nm and a $1^{St}$ exitonic absorption of 500-520 nm.

Alteration of the amount of indium precursor compound, phosphine precursor compound and acid can provide different size or wavelength semiconductor nanocrystals.

Example 4

Semiconductor Nanocrystal Growth Using Additional Precursors

Semiconductor nanocrystals are enlarged or grown by the following method. Indium myristate (575 mg) is added to 10 ml of 1-octadecene in a 4 neck flask. The mixture is degassed at 80° C. for 1 hour and the flask is filled with nitrogen.

A solution of InP semiconductor nanocrystal core particles in hexane is added to the flask and the hexane is removed by vacuum. The flask is then backfilled with nitrogen and the temperature is raised to 250° C. 110 mg of tris(trimethylsilyl)phosphine in 2 ml of 1-octadecene at 180° C. is slowly added dropwise over a 1 hour period. The reaction mixture is then cooled to room temperature and the semiconductor nanocrystals are isolated.

Figure 3:
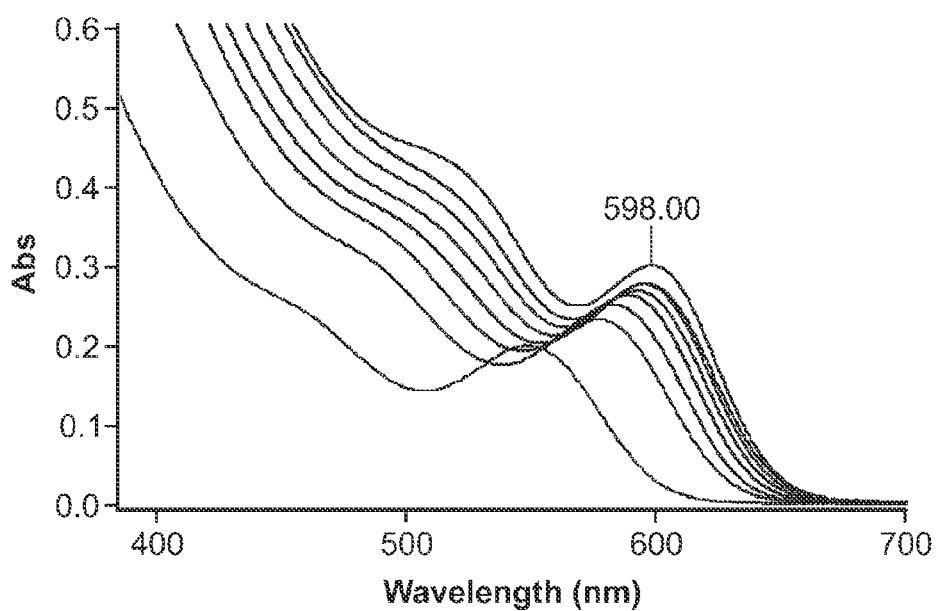
FIG. 3 is a graph of absorbance versus wavelength.

FIG. 3 is a graph of absorbance versus wavelength showing the growth process including non-pure indium myristate.

Example 5

Semiconductor Nanocrystal Growth Using Pure Indium Myristate

Semiconductor nanocrystals are enlarged or grown by the following method. Pure indium myristate (575 mg) is added to 10 ml of 1-octadecene and an additive, such as myristic acid in a 4 neck flask. The mixture is degassed at 80° C. for 1 hour and the flask is filled with nitrogen. Additional additives include 1-octadecanol, 2,2-biphenol, or water.

A solution of InP semiconductor nanocrystal core particles in hexane is added to the flask and the hexane is removed by vacuum. The flask is then backfilled with nitrogen and the temperature is raised to 250° C. 110 mg of tris(trimethylsilyl)phosphine in 2 ml of 1-octadecene at 180° C. is slowly added dropwise over a 1 hour period. The reaction mixture is then cooled to room temperature and the semiconductor nanocrystals are isolated.

Figure 4:
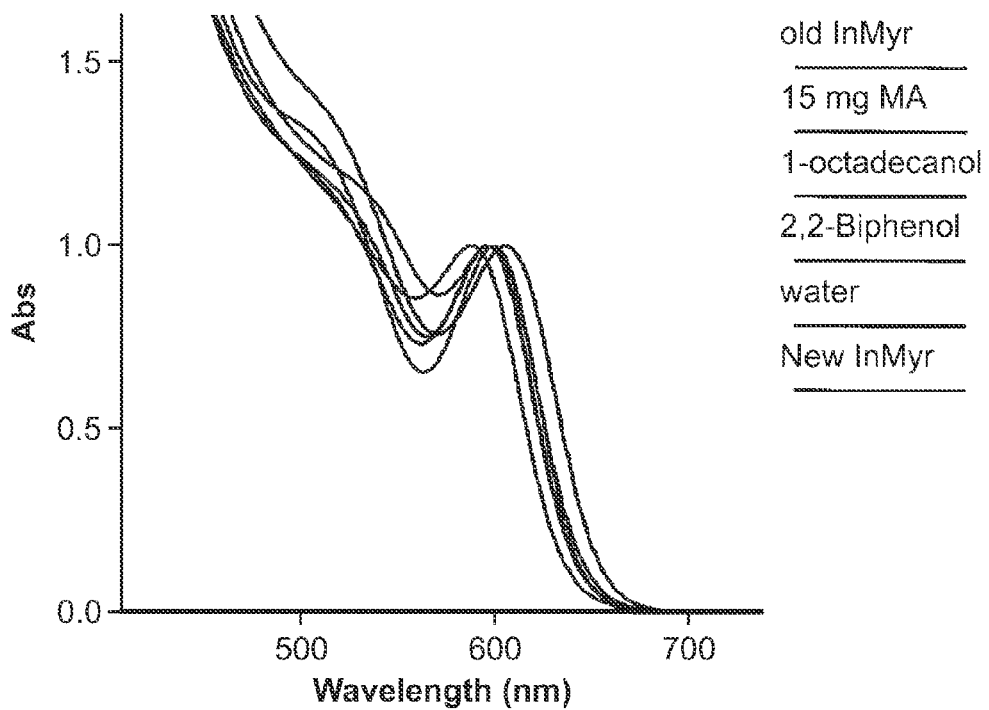
FIG. 4 is a graph of absorbance versus wavelength.

FIG. 4 is a graph of absorbance versus wavelength showing the effect of various growth promoters on semiconductor nanocrystal growth.

Figure 5:
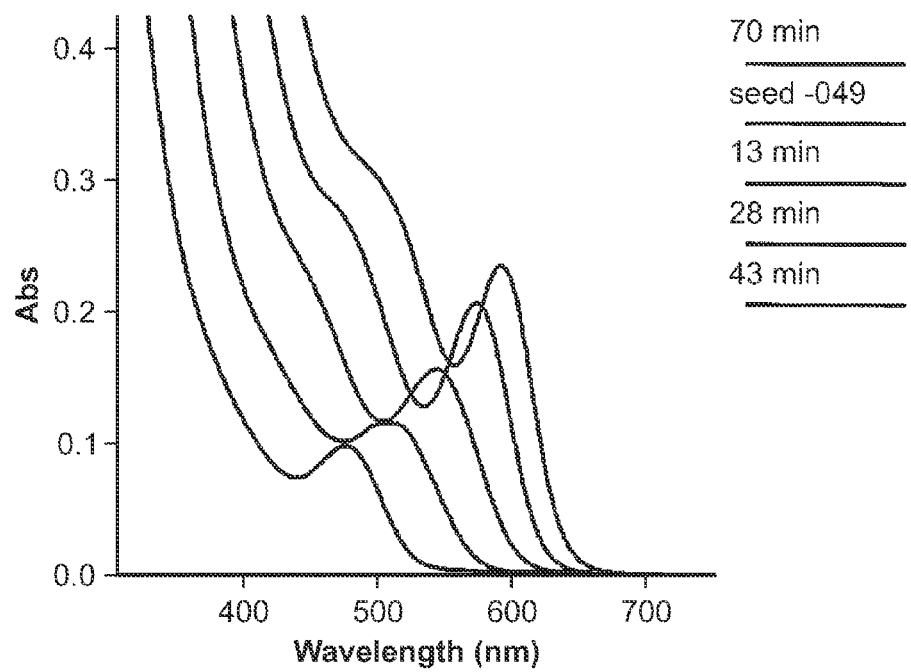
FIG. 5 is a graph of absorbance versus wavelength.

FIG. 5 is a graph of absorbance versus wavelength showing crystal growth over time using 1 equivalent of myristic acid with pure indium myristate. After 70 minutes, the semiconductor nanocrystals have an absorbance of 591 nm and a HWHM of 27.

The purity of the indium salt affects the growth of semiconductor nanocrystals, such as indium phosphide seed particles. Impure or substantially impure indium myristate successfully forms core particles with a small size distribution and high EQE when overcoated. However, when the indium myristate is pure or substantially pure, the indium phosphide seed particles do not grow or enlarge in size. Rather, the indium seed particles nucleate forming a broad absorbance feature and no second feature. The addition of water or alcohol promotes a prominent $1^{St}$ absorbance peak. When 1 equivalent of myristic acid is added to the reaction mixture, seed particles are enlarged or grown to produce a small size distribution and a prominent second feature. Without wishing to be bound by scientific theory, the myristic acid incorporates with the phosphine to help promote growth and decrease nucleation of the seed. As the amount of myristic acid is increased from 15 mg to 1 equivalent (109 mg myristic acid), the first exciton peak narrows and there is a prominent second feature at the end of the reaction.

Example 6

Semiconductor Nanocrystal Growth Using Pure Indium Myristate

Semiconductor nanocrystals are enlarged or grown by the following method. Pure indium myristate (575 mg) is added to 10 ml of 1-octadecene in a 4 neck flask. The mixture is degassed at 80° C. for 1 hour and the flask is filled with nitrogen.

A solution of InP semiconductor nanocrystal core particles in hexane is added to the flask and the hexane is removed by vacuum. The flask is then backfilled with nitrogen and the temperature is raised to 250° C. 110 mg of tris(trimethylsilyl)phosphine and an additive such as myristic acid in 2 ml of 1-octadecene at 180° C. is slowly added dropwise over a 1 hour period. The reaction mixture is then cooled to room temperature and the semiconductor nanocrystals are isolated.

Figure 6:
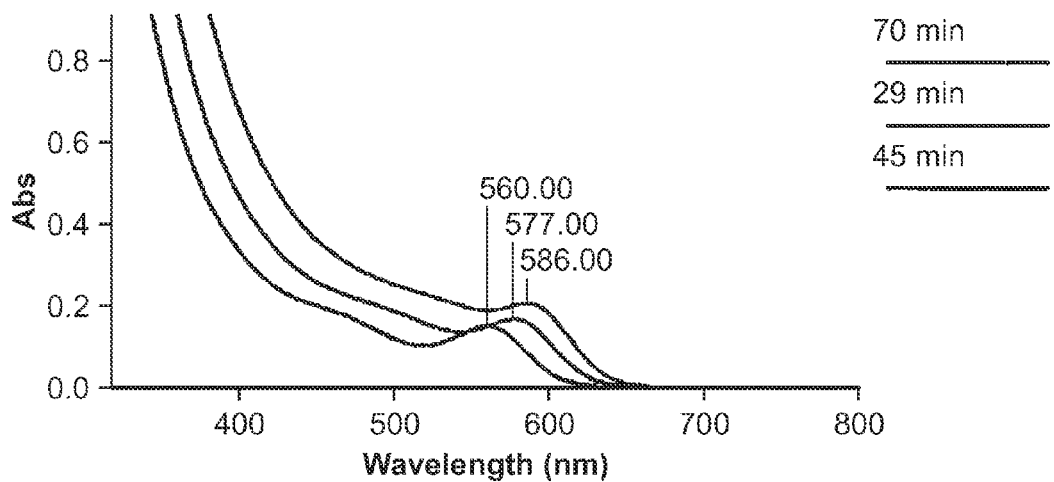
FIG. 6 is a graph of absorbance versus wavelength.

FIG. 6 is a graph of absorbance versus wavelength showing growth of InP cores from InP seeds using indium myristate and tris(trimethylsilyl)phosphine without the addition of any carboxylic acid.

Example 7

Semiconductor Nanocrystal Growth Using Indium Myristate and Carboxylic Acid

Semiconductor nanocrystals are enlarged or grown by the following method. Indium myristate (575 mg) is added to 10 ml of 1-octadecene in a 4 neck flask. The mixture is degassed at 80° C. for 1 hour and the flask is filled with nitrogen.

A solution of InP semiconductor nanocrystal core particles in hexane is added to the flask and the hexane is removed by vacuum. The flask is then backfilled with nitrogen and the temperature is raised to 250° C. 110 mg of tris(trimethylsilyl)phosphine and 1 equivalent of oleic acid or myristic acid in 2 ml of 1-octadecene at 180° C. is slowly added dropwise over a 1 hour period. The reaction mixture is then cooled to room temperature and the semiconductor nanocrystals are isolated.

Figure 7:
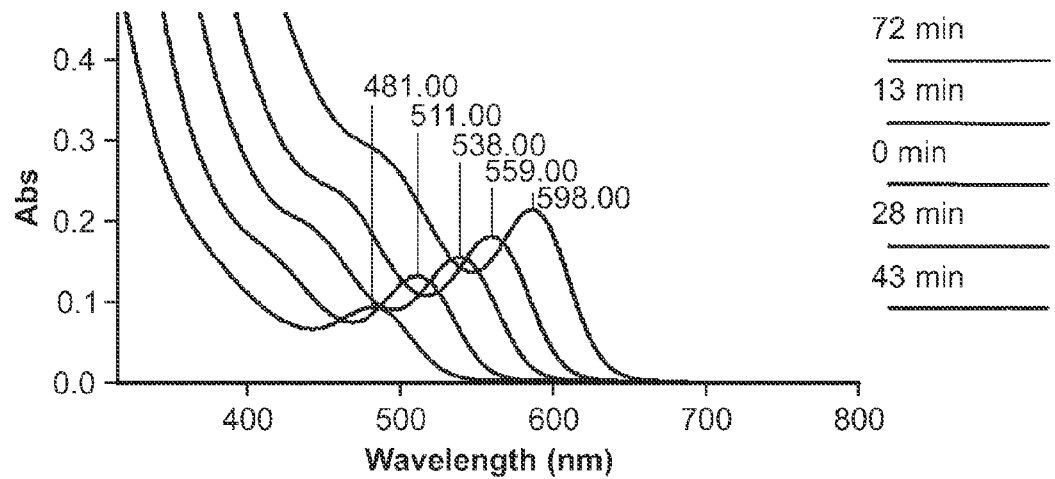
FIG. 7 is a graph of absorbance versus wavelength.

FIG. 7 is a graph of absorbance versus wavelength showing growth of InP cores from InP seeds using indium myristate and tris(trimethylsilyl)phosphine, with oleic acid added to the phosphine prior to addition of the tris(trimethylsilyl)phosphine. This figure illustrates the effect of the addition of oleic acid to the Group V precursor prior to controlled addition during growth.

The addition of 1 equivalent of carboxylic acid to the growth process of InP cores particles from InP seed particles using indium myristate and tris(trimethylsilyl)phosphine has a significant effect on the size distribution of the resulting InP core particles. Adding the carboxylic acid also reduces sensitivity of core particle production to the purity of the indium myristate. The method by which the carboxylic acid is added also affects the size distribution of the resulting InP core particles. An exemplary aspect is to expose the phosphine precursor to the carboxylic acid prior to addition, as this sequence produces a desirable size distribution.

Example 8

Semiconductor Nanocrystal Growth Using Indium Myristate and Carboxylic Acid

Semiconductor nanocrystals are enlarged or grown by the following method. Indium myristate (575 mg) and 1 equivalent of oleic acid or myristic acid is added to 10 ml of 1-octadecene in a 4 neck flask. The mixture is degassed at 80° C. for 1 hour and the flask is filled with nitrogen.

A solution of InP semiconductor nanocrystal core particles in hexane is added to the flask and the hexane is removed by vacuum. The flask is then backfilled with nitrogen and the temperature is raised to 250° C. 110 mg of tris(trimethylsilyl)phosphine in 2 ml of 1-octadecene at 180° C. is slowly added dropwise over a 1 hour period. The reaction mixture is then cooled to room temperature and the semiconductor nanocrystals are isolated.

Figure 8:
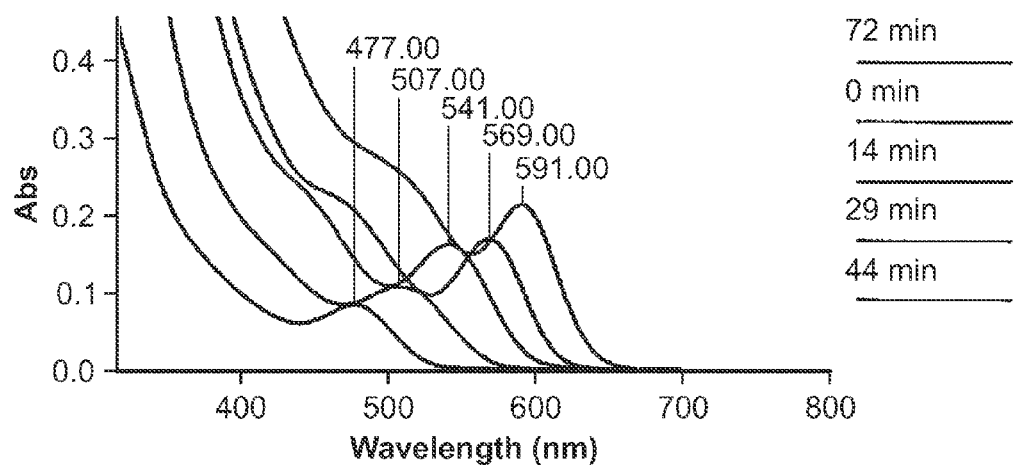
FIG. 8 is a graph of absorbance versus wavelength.

FIG. 8 is a graph of absorbance versus wavelength showing growth of InP cores from InP seeds using indium myristate and tris(trimethylsilyl)phosphine, with myristic acid added to the Group III precursor prior controlled addition during growth.

Example 9

Semiconductor Nanocrystal Growth and Overcoating

Semiconductor nanocrystals are enlarged or grown by the following method. Indium myristate (395 mg) is added to 10 ml of 1-octadecene in a 4 neck flask. The mixture is degassed at 80° C. for 1 hour and the flask is filled with nitrogen.

A 1.1 ml solution of InP semiconductor nanocrystal core particles in hexane is added to the flask and the hexane is removed by vacuum. The solution of InP semiconductor nanocrystal core particles are formed using a 1.1:1 ratio of In:P during a core growth process described herein. The flask is then backfilled with nitrogen and the temperature is raised to 257° C. 124 mg of tris(trimethylsilyl)phosphine in 2 ml of 1-octadecene at 160° C. is slowly added dropwise over a 1 hour period at the rate of 2 ml/hour. The reaction mixture is then stirred for 10 minutes at 257° C. to allow the core particles to further anneal.

The core particles within the reaction mixture are then overcoated as follows. Zn and S precursors (diethyl zinc and hexamethyldisilathiane, respectively) are prepared in 1-octadecene and placed in separate syringes in a glove box with 4 ml total volume of 1-octadecene in each syringe. Hexylphosphonic acid is dissolved in 4 ml of n-dodecyl pyrrolidone and placed in a 5 ml syringe in a glove box. Phenylbutylamine is placed in a 2 ml syringe in a glove box.

After the core particles are allowed to further anneal for 10 minutes at 257° C., the Zn and S precursors are injected into the reaction vessel and stirred for 3 minutes. Thereafter, the PBA is injected into the reaction vessel and stirred for 30 minutes. Thereafter the HPA/NDP is injected at a rate of 4 ml/hour for a 1 hour injection. After injection is complete, the reaction vessel is stirred to 2 hours. Thereafter, the temperature of the reaction mixture is reduced to 250° C. and maintained for 15 minutes. The reaction mixture is then cooled to room temperature and the reaction mixture is transferred to a vial under oxygen free conditions. Semiconductor nanocrystals were obtained from solution by using the isopropyl alcohol and methanol procedure described in Example 1 except that 5 ml toluene was used as a dispersant.

The procedure was repeated using a 1.1 ml solution of InP semiconductor nanocrystal core particles in hexane where the InP semiconductor nanocrystal core particles are formed using a 2:1 ratio of In:P during a core growth process described herein. The EQE for the resulting semiconductor nanocrystals is shown below. As can be seen, a 10%+ increase in film EQE was observed for the 1.1:1 In:P system. Without wishing to be bound by scientific theory, it is believed that reduction of residual excess indium precursors present during the in situ overcoating process, resulted in improved solid state external quantum efficiency for semiconductor nanocrystals in a solid state film.

| Sample # | Ratio of Indium Myristate to Phosphine | EQE |
|---|---|---|
| 1 | 2 to 1 | 73 |
| 2 | 1 to 1 | 92 |

Additional information that may be useful with the present invention is included in International Application No. PCT/US2007/13152 of Coe-Sullivan, et al., for "Light-Emitting Devices and Displays With Improved Performance", filed 4 Jun. 2007; International Application No. PCT/US2008/007901 of Linton, et al., for "Compositions And Methods Including Depositing Nanomaterial", filed 25 Jun. 2008; International Application No. PCT/US2008/01065 of Breen, et al., for "Functionalized Semiconductor Nanoparticles And Method", filed 12 Sep. 2008; International Application No. PCT/US2007/024750 of Coe-Sullivan, et al. for "Improved Composites And Devices Including Nanoparticles", filed 3 Dec. 2007; International Application No. PCT/US2009/004345, of Breen, et al for "Nanoparticle Including Multi-Functional Ligand And Method", filed 28 Jul. 2009, International Application No. PCT/US2007/024320, of Clough, et al., for "Nanocrystals Including A Group III A Element And A Group V A Element, Method, Composition, Device And Other Products", filed 21 Nov. 2007, and U.S. Ser. No. 12/283,609 of Coe-Sullivan, et al. for "Compositions, Optical Component, System Including An Optical Component, Devices, And Other Products", filed 12 Sep. 2008. The disclosures of each of the foregoing applications are hereby incorporated herein by reference in their entireties.

As used herein, the singular forms "a", "an" and "the" include plural unless the context clearly dictates otherwise. Thus, for example, reference to an emissive material includes reference to one or more of such materials.

The entire contents of all patent publications and other publications cited in this disclosure are hereby incorporated herein by reference in their entirety. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

The invention claimed is:

1. A method of preparing semiconductor nanocrystals of a semiconductor material including one or more elements of Group IIIA of the Periodic Table of Elements and one or more elements of Group VA of the Periodic Table of Elements comprising:

subjecting a mixture including one or more Group IIIA element precursors in a first solvent included in a reaction vessel at a first temperature of between about 25° C. and about 130° C., wherein the one or more Group IIIA element precursors comprise indium organic precursors;

adding semiconductor nanocrystal seed particles comprising the semiconductor material including one or more elements of Group IIIA of the Periodic Table of Elements and one or more elements of Group VA of the Periodic Table of Elements to the reaction vessel at a second temperature of between about 150° C. and about 300° C., wherein the one or more elements of Group IIIA of the Periodic Table of Elements comprise indium and the one or more elements of Group VA of the Periodic Table of Elements comprise phosphorous; and adding one or more Group VA element precursors to the reaction vessel in a dropwise manner over a period of time sufficient to enlarge the semiconductor nanocrystal seed particles and form semiconductor nanocrystal core particles of a predetermined size, wherein the one or more Group VA element precursors comprise phosphorous organic precursors.

2. The method of claim 1 wherein the one or more Group IIIA element precursors includes one or more cation salt precursors.

3. The method of claim 1 wherein the ratio of the one or more Group IIIA element precursors to the one or more Group VA element precursors is about 1:1 to about 2:1.

4. The method of claim 1 wherein the semiconductor nanocrystal core particles are isolated and then overcoated.

5. The method of claim 1 wherein the semiconductor nanocrystal core particles are overcoated in situ.

6. The method of claim 1 wherein the one or more Group IIIA element precursors and the one or more Group VA element precursors are present in the reaction mixture in a ratio of about 1.1:1 or about 1.2:1.

7. A method of preparing semiconductor nanocrystals of a semiconductor material including one or more elements of Group IIIA of the Periodic Table of Elements and one or more elements of Group VA of the Periodic Table of Elements comprising:

mixing one or more pure Group IIIA element precursors and a carboxylic acid in a solvent in a reaction vessel and heating at a first temperature of between about 25° C. and about 130° C., wherein the one or more Group IIIA element precursors comprise indium organic precursors;

adding semiconductor nanocrystal seed particles comprising the semiconductor material including one or more elements of Group IIIA of the Periodic Table of Elements and one or more elements of Group VA of the Periodic Table of Elements to the reaction vessel at a second temperature of between about 150° C. and about 300° C., wherein the one or more elements of Group IIIA of the Periodic Table of Elements comprise indium and the one or more elements of Group VA of the Periodic Table of Elements comprise phosphorous; and adding one or more Group VA element precursors to the reaction vessel over a period of time sufficient to form semiconductor nanocrystal core particles of a predetermined size, wherein the one or more Group VA element precursors comprise phosphorous organic precursors.

8. The method of claim 7 wherein the carboxylic acid is added to the reaction vessel before the one or more pure Group IIIA element precursors are added to the reaction vessel.

9. The method of claim 7 wherein the one or more Group IIIA element precursors includes one or more cation salt precursors.

10. The method of claim 7 wherein the ratio of the one or more Group IIIA element precursors to the one or more Group VA element precursors is about 1:1 to about 2:1.

11. The method of claim 7 wherein the one or more Group IIIA element precursors includes indium myristate.

12. The method of claim 7 wherein the semiconductor nanocrystal core particles are isolated and then overcoated.

13. The method of claim 7 wherein the semiconductor nanocrystal core particles are overcoated in situ.

14. The method of claim 7 wherein the one or more Group IIIA element precursors and the one or more Group VA element precursors are present in the reaction mixture in a ratio of about 1.1:1 or about 1.2:1.

* * * * *